(12) United States Patent
Poelzl et al.

(10) Patent No.: US 11,699,725 B2
(45) Date of Patent: Jul. 11, 2023

(54) SEMICONDUCTOR DEVICE HAVING AN ALIGNMENT LAYER WITH MASK PITS

(71) Applicant: Infineon Technologies Austria AG, Villach (AT)

(72) Inventors: Martin Poelzl, Ossiach (AT); Oliver Blank, Villach (AT); Franz Hirler, Isen (DE); Maximilian Roesch, St. Magdalen (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 78 days.

(21) Appl. No.: 17/119,389

(22) Filed: Dec. 11, 2020

(65) Prior Publication Data

US 2021/0098580 A1 Apr. 1, 2021

Related U.S. Application Data

(62) Division of application No. 14/881,477, filed on Oct. 13, 2015, now Pat. No. 10,903,321.

(30) Foreign Application Priority Data

Oct. 21, 2014 (DE) .......................... 102014115321.9

(51) Int. Cl.
*H01L 29/40* (2006.01)
*H01L 29/423* (2006.01)
(Continued)

(52) U.S. Cl.
CPC ........ *H01L 29/407* (2013.01); *H01L 21/3086* (2013.01); *H01L 29/404* (2013.01); *H01L 29/41766* (2013.01); *H01L 29/4236* (2013.01); *H01L 29/66348* (2013.01); *H01L 29/66719* (2013.01); *H01L 29/66727* (2013.01);
(Continued)

(58) Field of Classification Search
CPC H01L 29/407; H01L 29/404; H01L 29/41766
See application file for complete search history.

(56) References Cited

U.S. PATENT DOCUMENTS 6,798,013 B2 9/2004 Gonzalez et al.
8,748,976 B1* 6/2014 Kocon ................ H01L 29/7802
257/330

(Continued)

FOREIGN PATENT DOCUMENTS

CN  1447982 A     10/2003
CN  102549754 A    7/2012
DE  112010003051 T5  6/2012

*Primary Examiner* — Samuel A Gebremariam
(74) *Attorney, Agent, or Firm* — Murphy, Bilak & Homiller, PLLC

(57) ABSTRACT

A semiconductor device includes a gate structure extending from a first surface of a semiconductor portion into a mesa section between neighboring field electrode structures and an alignment layer formed on the first surface. The alignment layer includes mask pits formed in the alignment layer in a vertical projection of the field electrode structures. Sidewalls of the mask pits have a smaller tilt angle with respect to the first surface than sidewalls of the field electrode structures. The gate structure is in the vertical projection of a gap between neighboring mask pits.

20 Claims, 20 Drawing Sheets

(51) Int. Cl.
    *H01L 29/66*         (2006.01)
    *H01L 29/78*         (2006.01)
    *H01L 29/739*       (2006.01)
    *H01L 21/308*       (2006.01)
    *H01L 29/417*       (2006.01)
    *H01L 29/06*         (2006.01)

(52) U.S. Cl.
    CPC .... *H01L 29/66734* (2013.01); *H01L 29/7397* (2013.01); *H01L 29/7813* (2013.01); *H01L 29/0696* (2013.01); *H01L 29/7811* (2013.01)

(56) References Cited

U.S. PATENT DOCUMENTS

| | | |
|---|---|---|
| 8,772,111 B2 | 7/2014 | Ikura |
| 2008/0090356 A1 | 4/2008 | Park et al. |
| 2013/0115747 A1 | 5/2013 | Ikura |

\* cited by examiner

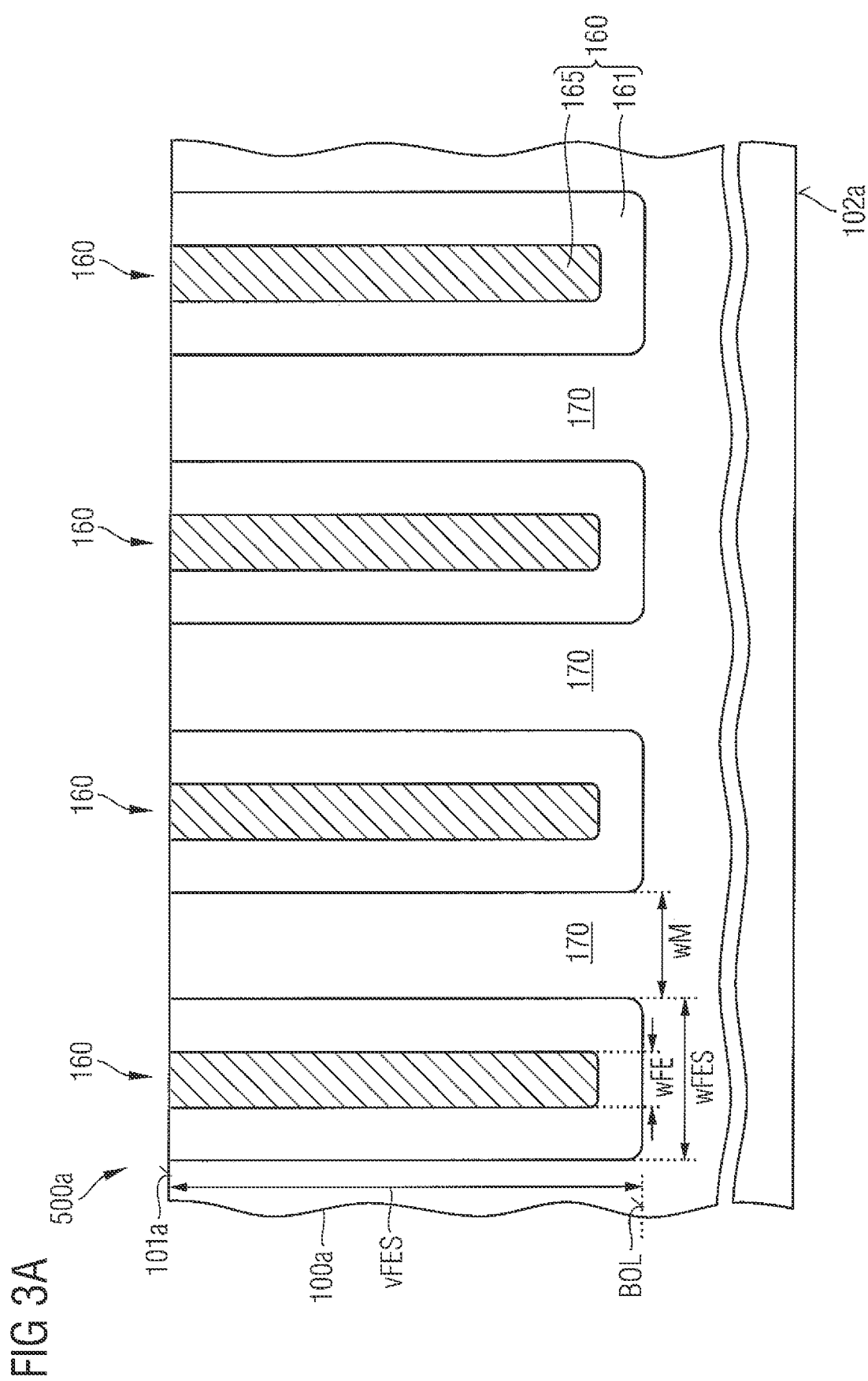

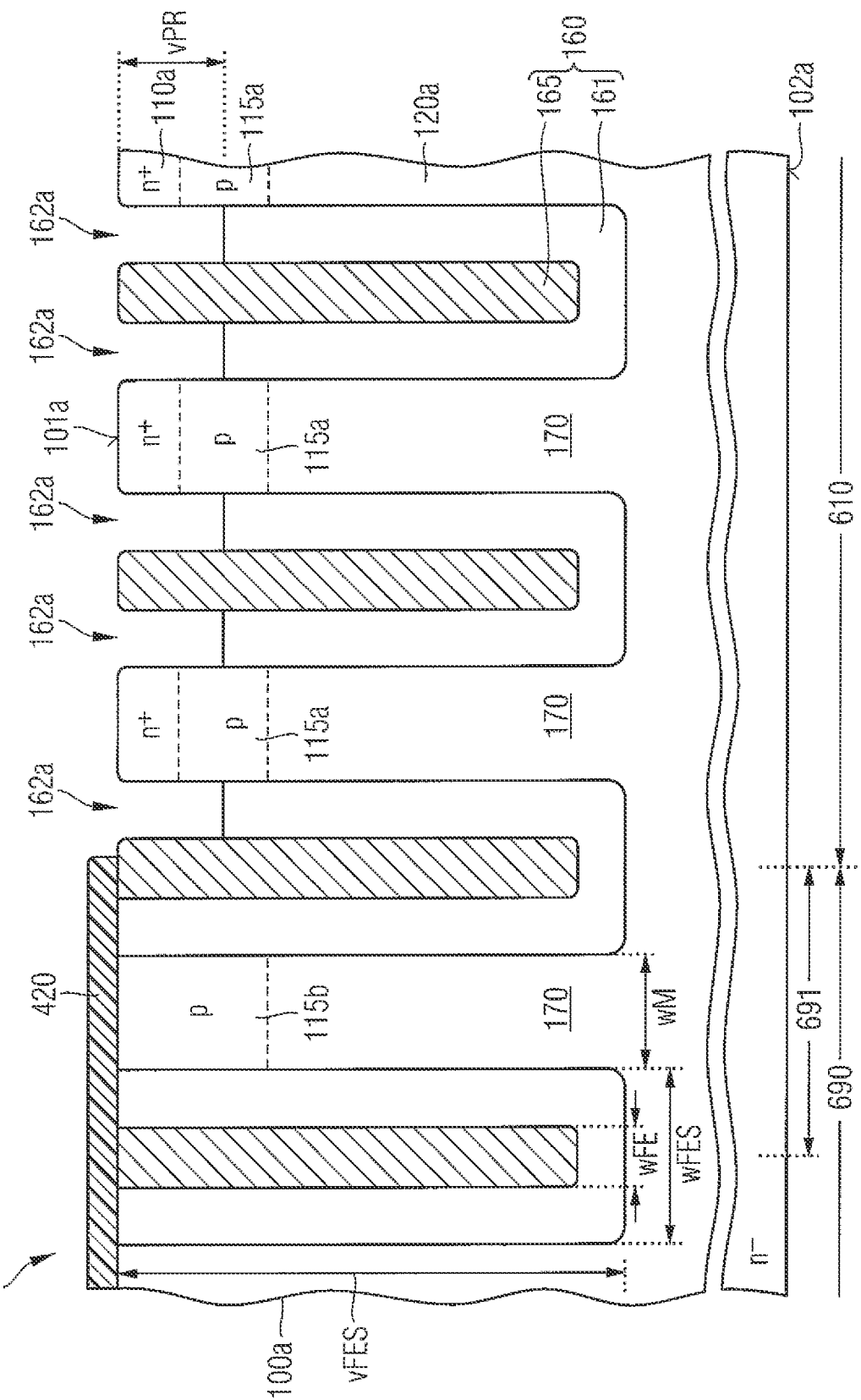

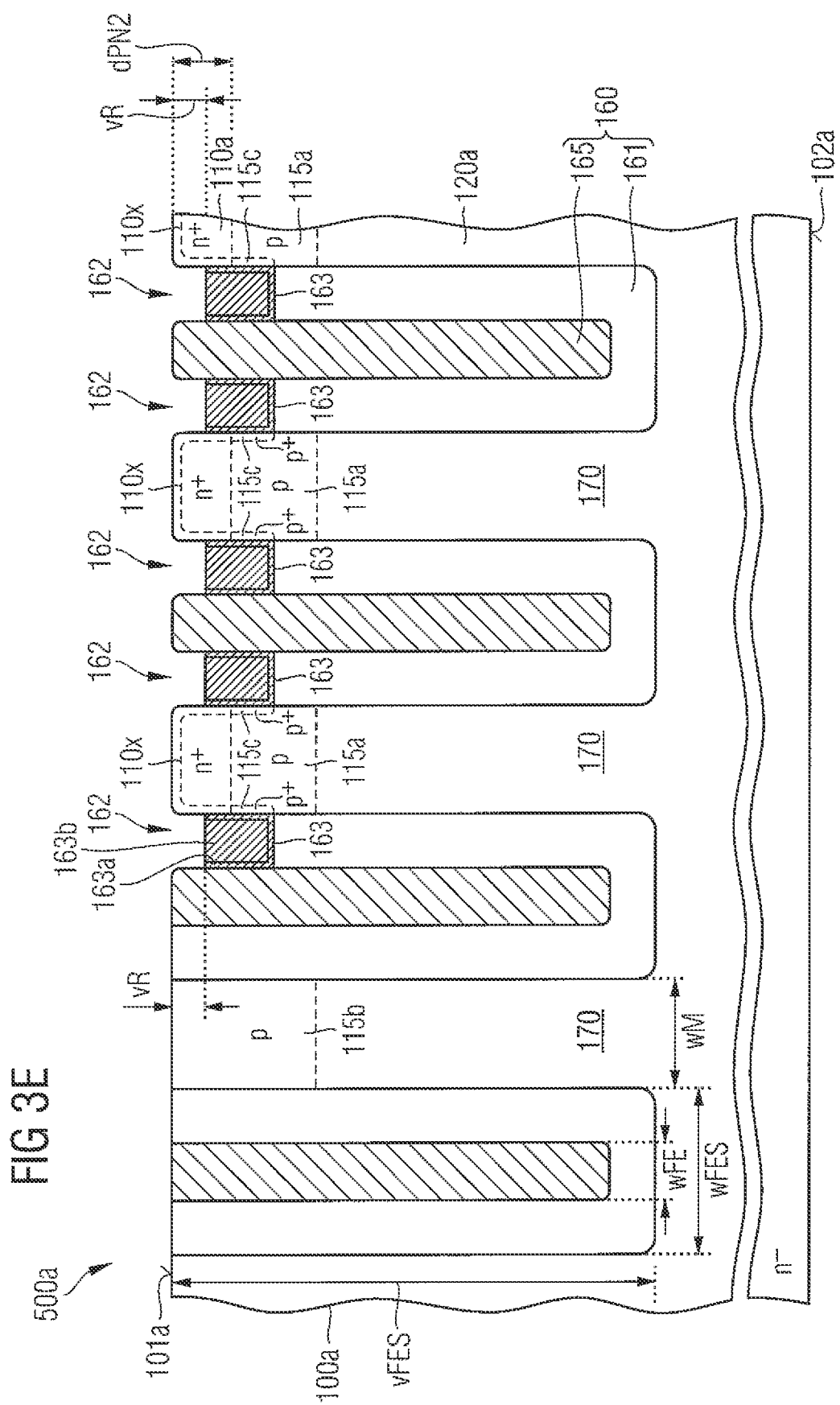

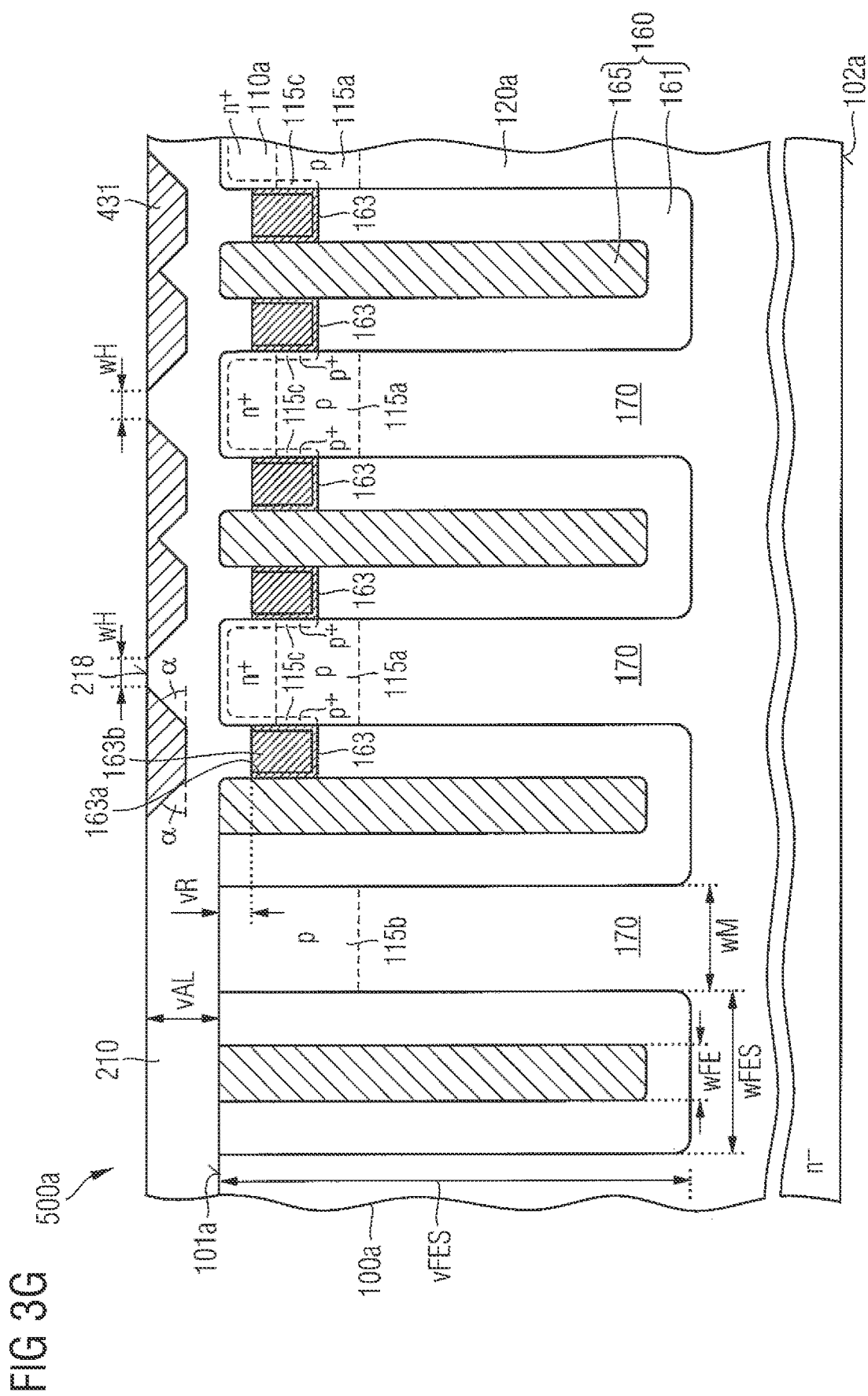

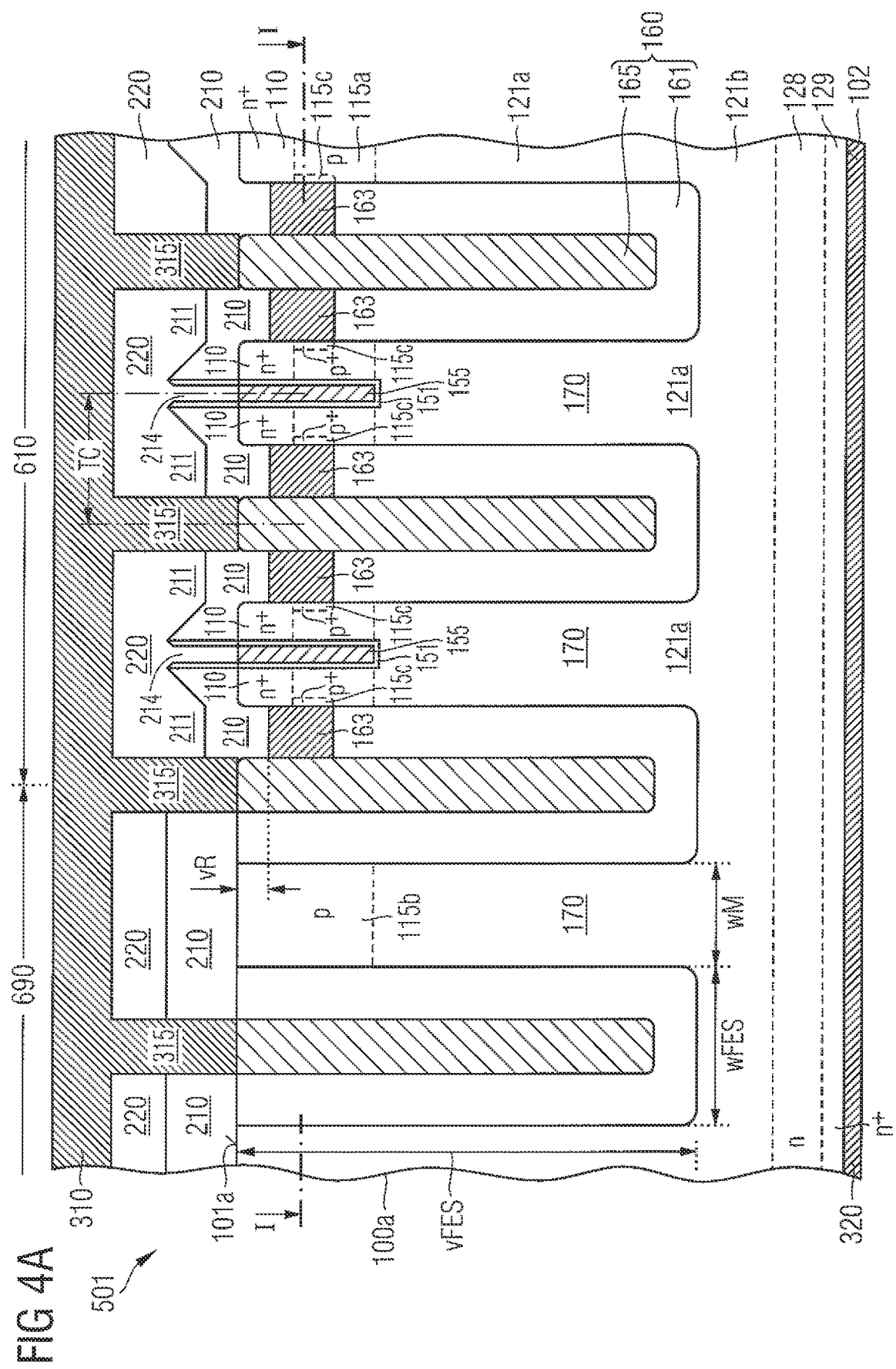

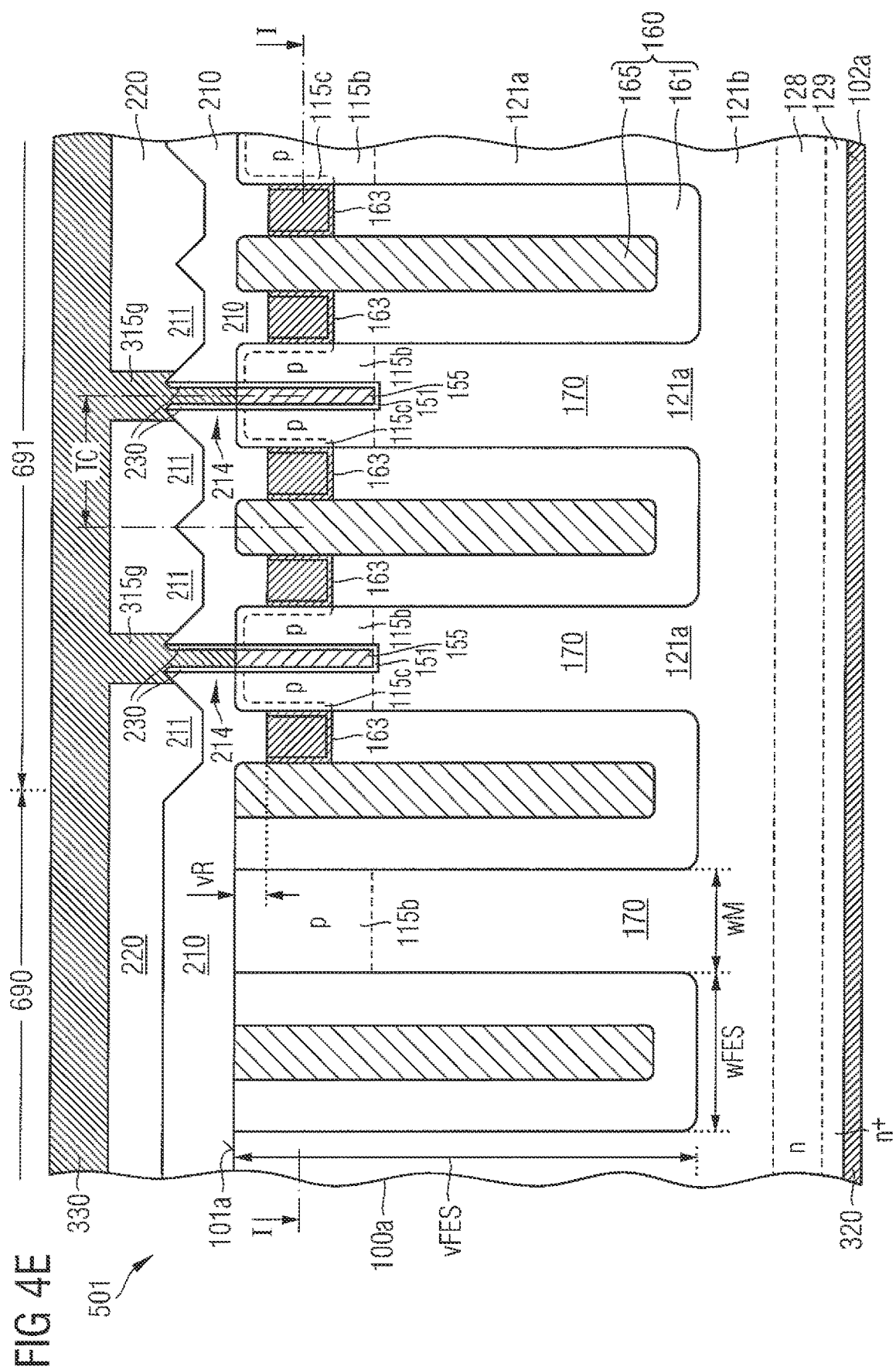

SEMICONDUCTOR DEVICE HAVING AN ALIGNMENT LAYER WITH MASK PITS

BACKGROUND

The present application claims priority under 35 U.S.C. § 119 to German (DE) Patent Application Serial No. DE 10 2014 115 321.9 filed on Oct. 21, 2014. The disclosure in this priority application is hereby incorporated fully by reference into the present application.

BACKGROUND ART

Power semiconductor devices such as power semiconductor diodes, IGFETs (insulated gate field effect transistors) and IGBTs (insulated gate bipolar transistors) are typically vertical devices with a load current flow between a first surface at a front side of a semiconductor die and a second surface at the opposite rear side. Compensate on structures extending from the front side into the semiconductor die deplete a drift zone formed in the semiconductor die in a blocking mode. The compensation structures allow higher dopant concentrations in the drift zone without adverse impact on the blocking capabilities.

It is desirable to improve the device characteristics of semiconductor devices.

SUMMARY

According to an embodiment a method of manufacturing a semiconductor device includes forming first trenches extending from a process surface into a semiconductor layer. An alignment layer with mask pits in a, with respect to the process surface, vertical projection of the first trenches is formed on the process surface. Sidewalls of the mask pits have a smaller tilt angle with respect to the process surface than sidewalls of the first trenches. The mask pits are filled with an auxiliary material. A gate trench for a gate structure is formed in a mesa section between the first trenches, wherein the auxiliary material is used as an etch mask.

According to another embodiment a semiconductor device includes a gate structure extending from a first surface of a semiconductor portion into a mesa section between neighboring field electrode structures. An alignment layer is formed on the first surface, wherein the alignment layer comprises mask pits in a with respect to the first surface vertical projection of portions of the field electrode structures. Sidewalls of the mask pits have a smaller tilt angle with respect to the process surface than sidewalls of the field electrode structures. The gate structure is in the vertical projection of a gap between neighboring mask pits.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4A is a schematic cross-sectional view of a portion of a semiconductor device including field electrode structures obtained by the method illustrated in FIGS. 3A to 3K.

FIG. 4E is a schematic vertical cross-sectional view of a portion of a transition region of the semiconductor device of FIG. 4A in a plane parallel to the cross-sectional plane of FIG. 4A according to an embodiment related to self-aligned gate contacts.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention induces such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" indicates a doping concentration which is lower than the doping concentration of an "n"-doping region, whereas an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
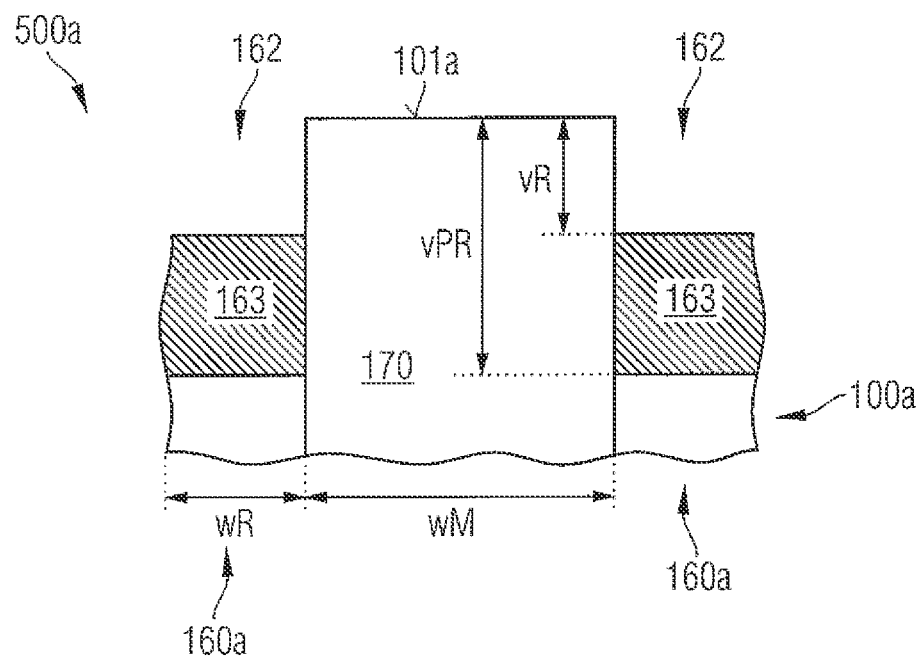
FIG. 1A is a schematic cross-sectional view of a portion of a semiconductor substrate for illustrating a method of manufacturing a semiconductor device according to an embodiment, after forming first trenches.
Figure 1B:
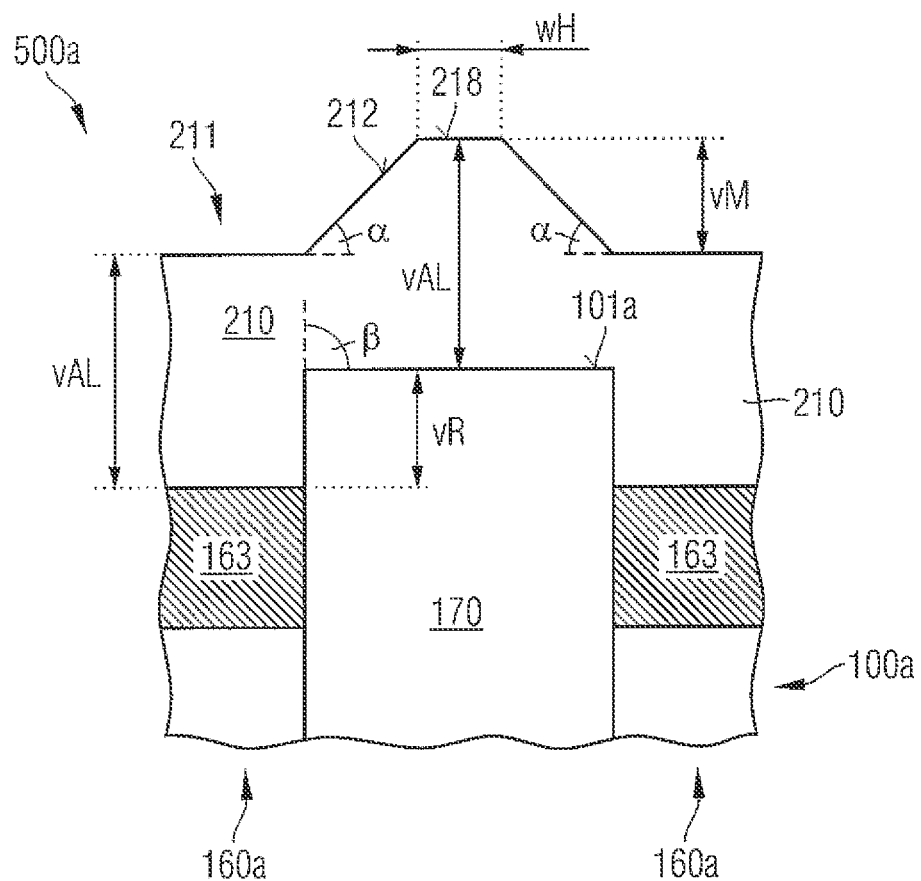
FIG. 1B is a schematic cross-sectional view of the semiconductor substrate portion of FIG. 1A, after forming an alignment layer with mask pits in the vertical projection of the first trenches.
Figure 1C:
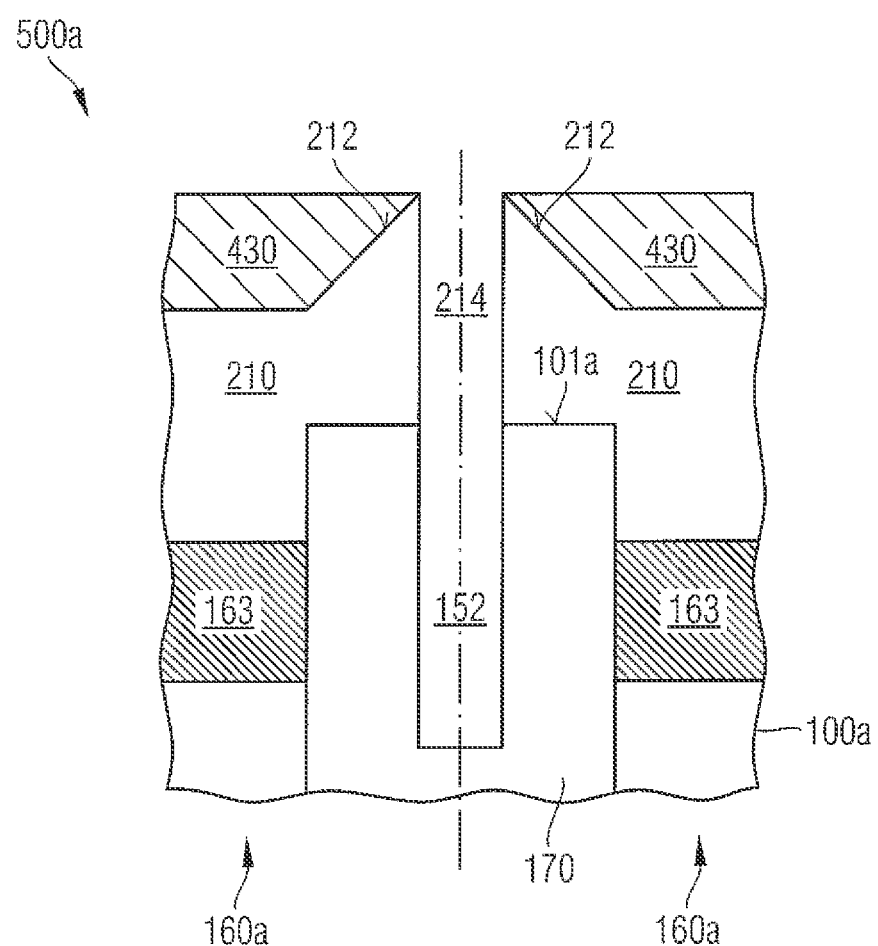
FIG. 1C is a schematic cross-sectional view of the semiconductor substrate portion of FIG. 1B after forming a gate trench self-aligned to the first trenches.

FIGS. 1A to 1C illustrate a sequence of processes providing gate structures self-aligned to previously formed subsurface structures, wherein the subsurface structures may be compensation structures or portions of compensation structure, by way of example. The term "self-aligned" as used in the following indicates that the position of the gate structures in relation to the subsurface structures is not subject to a possible miss-alignment between two or more photolithographic masks. Instead, the position of the gate structures relative to the subsurface structures is defined by non-photolithographic patterning processes, which include deposition and etch processes.

The semiconductor substrate 500a illustrated in FIG. 1A consists of or includes a semiconductor layer 100a of a single-crystalline semiconductor material. The single-crystalline semiconductor material may be silicon (Si), silicon carbide (SiC), germanium (Ge), a silicon-germanium crystal (SiGe), gallium nitride (GaN) or gallium arsenide (GaAs), or another $A_{III}B_V$ semiconductor, by way of example. The semiconductor substrate 500a may include further semiconductor and dielectric layers in addition to the semiconductor layer 100a. According to an embodiment, the semiconductor substrate 500a is a silicon wafer, wherein the semiconductor layer 100a may be a silicon disk obtained by cutting a silicon crystal or entirely or in portions grown by epitaxy on a single-crystalline substrate. The semiconductor layer 100a may include two or more sub-layers of different conductivity types or of the same conductivity type but differing in a mean dopant concentration.

The semiconductor layer 100a forms a planar process surface 101a at a front side of the semiconductor substrate 500a. A normal to the process surface 101a defines a vertical direction. Directions orthogonal to the vertical direction are horizontal directions.

First trenches 162 extend from a plane spanned by the process surface 101a into the semiconductor layer 100a. Portions of the semiconductor layer 100a between neighboring first trenches 162 form mesa sections 170. A width wR of the first trenches 162 and a distance wM between neighboring first trenches 162 are defined by the applied photolithography process.

The first trenches 162 may be trenches etched into the semiconductor layer 100a. According to other embodiments the first trenches 162 may be formed by recessing subsurface structures 160a or portions of subsurface structures 160a previously formed in the semiconductor layer 100a. The subsurface structures 160a may be conductive structures, for example contact structures, or insulator structures, for example device isolations. According to other embodiments, the subsurface structures 160a are control structures made up of sub-structures of different materials such as a first set of gate structures, auxiliary control structures or field electrode structures. The first trenches 162 may be formed by recessing the complete subsurface structures 160a or by recessing portions of the subsurface structures 160a. According to an embodiment, the subsurface structures 160a are field electrode structures including a conductive field electrode as well as a field dielectric separating the field electrode from the semiconductor material of the semiconductor layer 100a, wherein the first trenches 162 may be formed at least in portions of the field dielectrics.

According to the illustrated embodiment, the first trenches 162 are formed by etching recesses 162a with a vertical extension vPR into the subsurface structures 160a, filling lower portions of the recesses 162a with a conductive material, and recessing the deposited conductive material to form buried contacts 163 in a distance to the process surface 101a as well as the first trenches 162 with a vertical extension vR between the buried contacts 163 and the process surface 101a.

FIG. 1A shows the subsurface structures 160a on opposite sides of an intermediate mesa section 170. First trenches 162 extend from the process surface 101a down to buried contacts 163 at a distance to the process surface 101a given by the vertical extension vR of the first trenches 162. The buried contacts 163 extend between a first distance given by the vertical extension vR of the first trenches 162 and a second distance to the process surface 101a given by the vertical extension vPR of the recesses 162a. The vertical extension vR of the first trenches 162 is in a range from 50 nm to 300 nm, for example in a range from 100 nm to 200 nm. According to an embodiment, the vertical extension vR may be between 150 nm and 170 nm. The horizontal width wR of the first trenches 162 may be in a range from 50 nm to 200 nm, for example in a range from 100 nm to 150 nm.

An alignment layer 210 that covers the process surface 101a and that fills the first trenches 162 is formed in a way that mask pits 211 are in situ formed in the alignment layer 210 in the vertical projection of the first trenches 162. According to an embodiment, the alignment layer 210 is formed by a deposition process with a conformal deposition component and a sputter component smoothing steep edges in the deposited layer. According to an embodiment, a process for forming the alignment layer 210 combines highly conformal deposition from the gaseous phase with sputtering based on, by way of example, low-energy ions that remove deposited material along exposed steep edges more rapidly than from other regions. According to an embodiment, an HDP (high density plasma) process deposits silicon oxide to form the alignment layer 210. During deposition, a sputter process may be based on arsenic ions, oxygen ions or $SiH_4$ ions.

As shown in FIG. 1B, the alignment layer 210 covers the process surface 101a and completely fills the first trenches 162. The mask pits 211 are formed in the vertical projection of the buried contacts 163. A vertical extension vM of the mask pitches 211 is approximately equal to the vertical extension vR of the first trenches 162. A tilt angle α between sidewalls 212 of the mask pits 211 and the process surface 101a is smaller than a tilt angle β between the sidewalls of the first trenches 162 and the process surface 101a. The tilt angle α may be in a range from 30 degree to 60 degree, for example in a range from 40 to 45 degree. According to an embodiment, the tilt angle α is approximately 43 degree.

A thickness vAL of the alignment layer 210 is set considering the mesa width wM between neighboring subsurface structures 160a, the tilt angle α and a target distance between the subsurface structures 160a and the gate structures 150 and may be greater than the vertical extension vM of the mask pits 211. For example, the thickness vAL of the alignment layer 210 is selected such that an exposed surface of the alignment layer 210 has a horizontal portion 218 in the vertical projection of the mesa section 170, wherein the horizontal portion 218 is parallel to the process surface 101a and has a horizontal width wH of at least 20 nm, for example at least 40 nm.

An auxiliary material different from the material of the alignment layer 210 is deposited to completely fill the mask pits 211. Portions of the auxiliary material outside the mask pits 211 are removed, for example using a CMP (chemical mechanical polishing) process slopping at the horizontal portions 218 of the exposed surface of the alignment layer 210. According to an embodiment, after the CMP the deposited and polished auxiliary material may be slightly recessed in order to adjust the distance between neighboring portions of the deposited auxiliary material and to compensate for process fluctuations concerning the alignment layer 210. The auxiliary material may be any material against which the material of the alignment layer 210 and, optionally, the semiconductor layer 100a may be etched with high selectivity. For example, the auxiliary material may be amorphous silicon, carbon, or a photoresist. According to an embodiment, the auxiliary material is polycrystalline silicon.

The polished and, optionally, recessed auxiliary material forms an etch mask 430 or a portion of an etch mask for forming a gate trench 152 in the semiconductor mesa 170. For example, in a first step, a mask opening 214 may be formed by an etch process removing the material of the alignment layer 210 selectively with respect to the auxiliary material of the etch mask 430. In a second step, the gate trench 152 is formed in the semiconductor layer 100a in a portion exposed by the mask opening 214.

FIG. 1C shows the gate trench 152 formed in a self-aligned manner in the center of the semiconductor mesa 170 between neighboring subsurface structures 160a. When, according to a comparative example, the gate trenches 152 are formed by a second photolithography mask, alignment tolerances of some 10 nanometers have to be considered when selecting the mesa width wM in order to ensure a minimum distance between the gate trenches 152 and the subsurface structures 160a. Using the self-aligned approach as illustrated, no alignment tolerance has to be considered such that a smaller mesa width wM can be obtained at high yield. In addition, the self-aligned approach may save an expensive photolithography process.

According to embodiments including the formation of the buried contacts 163, conductive structures in the mesa section 170 can be electrically connected to conductive structures in the subsurface structure 160a without any contact structures consuming material of the mesa section 170.

The following Figures refer to semiconductor devices with n-channel IGFET cells. Equivalent considerations apply to p-channel IGFET cells with a complementary doping.

Figure 2:
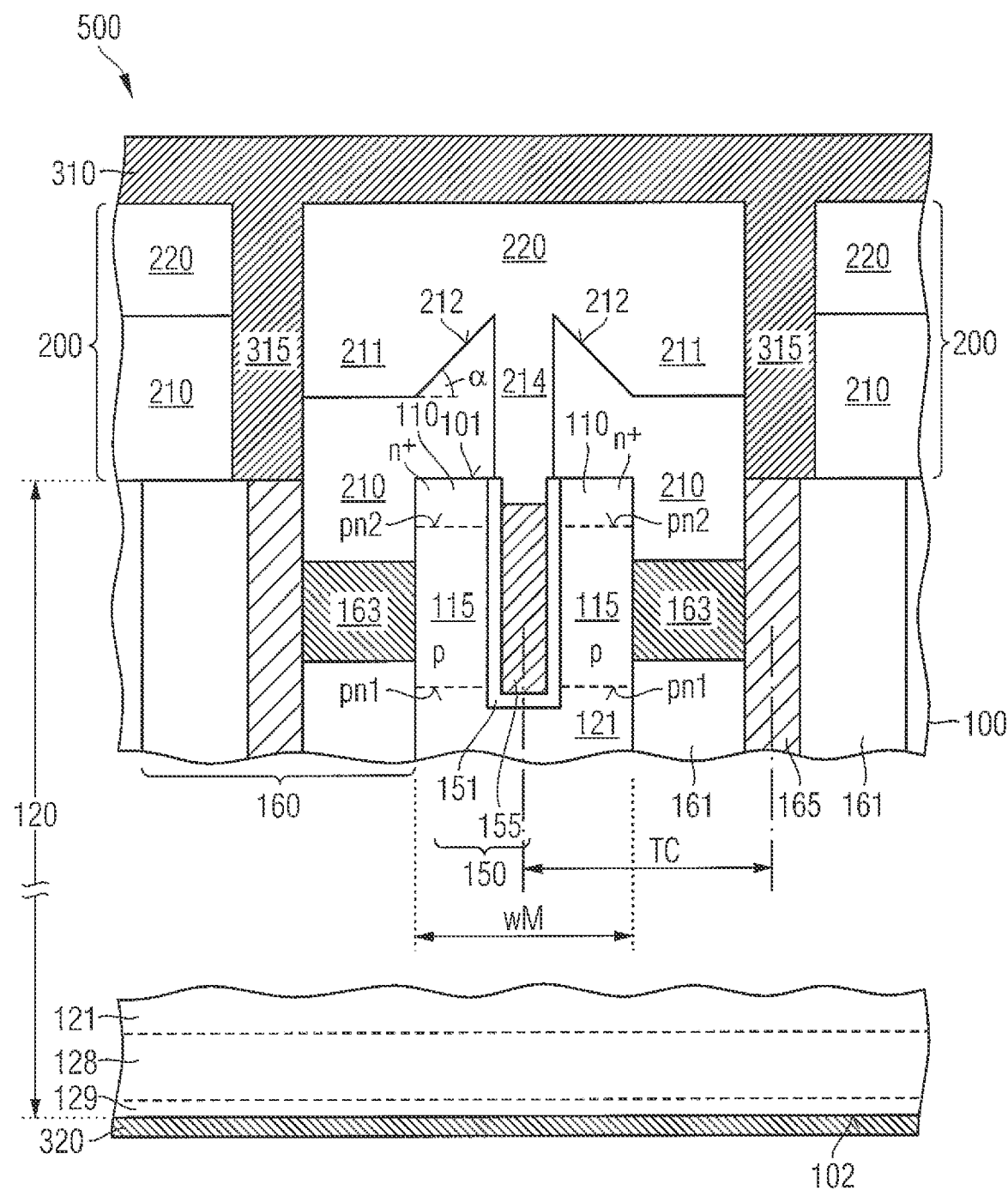
FIG. 2 is a schematic cross-sectional view of a portion of a semiconductor device obtained by the method of manufacturing as illustrated in FIGS. 1A to 1C according to an embodiment.

FIG. 2 illustrates a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT or an MGD (MOS gated diode).

The semiconductor device 500 is based on a semiconductor portion 100 from a single crystalline semiconductor material such as Si, SiC, Ge, SiGe, GaN, GaAs or any other $A_{III}B_V$ semiconductor and with a first surface 101 at a front side and a second surface 102 at an opposite rear side.

The semiconductor portion 100 includes a drift and rear side structure 120 with a heavily doped contact portion 129 formed along the second surface 102. The drift and rear side structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between $1E13$ cm$^{-3}$ and $1E17$ cm$^{-3}$, for example in a range from $5E15$ cm$^{-3}$ to $5E16$ cm$^{-3}$. The drift and rear side structure 120 may include further doped zones, for example a field stop layer 128 that separates the drift zone 121 from the contact portion 129. A mean dopant concentration in the field stop layer 128 may be at least five times as high as a mean dopant concentration in the drift zone 121 and at most one-fifth of a maximum dopant concentration in the contact portion 129.

The contact portion 129 may be a heavily doped base substrate or a heavily doped layer. Along the second surface 102 a dopant concentration in the contact portion 129 is sufficiently high to form an ohmic contact with a metal directly adjoining the second surface 102. In case the semiconductor portion 100 is based on silicon, in an n-conductive contact portion 129 the dopant concentration along the second surface 102 may be at least 1E18 cm$^{-3}$, for example at least 5E19 cm$^{-3}$. In a p-conductive contact portion 129, the dopant concentration may be at least 1E16 cm$^{-3}$, for example at least 5E17 cm$^{-3}$.

Each transistor cell TC includes a field electrode structure 160 or a portion of a field electrode structure 160 extending from the first surface 101 into the semiconductor portion 100. Portions of the field electrode structure 160 between the first surface 101 and a buried end portion may have approximately vertical sidewalls or may slightly taper with respect to the first surface 101. The sidewalls may be straight or slightly bulgy.

The field electrode structures 160 may include a stripe-shaped field electrode 165 or a spicular or needle-shaped field electrode 165 as well as a field dielectric 161 surrounding the field electrode 165, respectively. The field electrode 165 includes or consists of a heavily doped polycrystalline silicon layer and/or a metal-containing layer. The field dielectric 161 separates the field electrode 165 from the surrounding semiconductor material of the semiconductor portion 100 and may include or consist of a thermally grown silicon oxide layer, a deposited silicon oxide layer, e.g. a silicon oxide based on TEOS (tetraethyl orthosilicate), or both.

A vertical extension of the field electrode structures 160 may be in a range from 1 μm to 50 μm, for example in a range from 2 μm to 20 μm. A first horizontal extension of the field electrode 165 may be at most three times or at most twice as large as a second horizontal extension orthogonal to the first horizontal extension. The second horizontal extension may be in a range from 0.1 μm to 20 μm, for example in a range from 0.2 μm to 5 μm.

The cross-sectional areas of the field electrodes 165 and the field electrode structures 160 may be rectangles, or regular or distorted polygons, with or without rounded and/or beveled corners, respectively. According to an embodiment, the first and second horizontal extensions are approximately equal and the cross-sectional areas of the field electrodes 165 rand the field electrode structures 160 are regular polygons such as octagons, hexagons or squares, with or without rounded or beveled corners, respectively.

According to other embodiments, the cross-sectional areas of the field electrodes 165 and the field electrode structures 160 may be ellipses or ovals. The first and second horizontal extensions may be approximately equal such that the horizontal cross-sectional areas of the field electrodes 165 and the field electrode structures 160 are circles. In case of specular field electrodes 165, the transistor cells TC may be arranged matrix-like in lines and rows. According to other embodiments, the transistor cells TC may be arranged in shifted lines, wherein the odd lines are shifted with respect to the even lines by half the distance between two transistor cells TC along the line.

Semiconducting portions of the transistor cells TC are formed in the mesa sections 170 of the semiconductor portion 100, wherein the mesa sections 170 may surround the respective field electrode structure 160. The mesa sections 170 protrude from a contiguous section of the semiconductor portion 100. A horizontal minimum width wM of the mesa section 170 may be in a range from 0.3 μm to 2 μm, for example in a range from 0.4 μm to 1 μm. Each mesa section 170 may include a body zone 115 forming a first pn junction pn1 with a section of the drift zone 121 in the concerned mesa section 170 as well as one or more source zones 110 forming second pn junctions pn2 with the body zones 115. The body zones 115 separate the source zones 110 from the drift zone 121.

A gate structure 150 includes a conductive gate electrode 155 that may include or consist of a heavily doped polycrystalline silicon layer and/or a metal-containing layer. The gate electrode 155 is completely insulated against the semiconductor portion 100, wherein a gate dielectric 151 separates the gate electrode 155 at least from the body zone 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof. The gate structure 150 may be a trench gate extending from the first surface 101 into the semiconductor portion 100.

In the illustrated embodiments and for the following description, the transistor cells TC are n channel IGFET cells with p doped body zones 115 and n doped source and drift zones 110, 121. Similar considerations as outlined below apply also to embodiments including p channel IGFET cells with a complementary doping.

When a voltage applied to the gate electrode 150 exceeds a preset threshold voltage, electrons accumulate in the channel portions of the body zones 115 directly adjoining the gate dielectric 151 and form inversion channels making the second pn junctions pn2 permeable for electrons.

A vertical extension of the gate structures 150 is smaller than the vertical extension of the field electrode structures 160. The vertical extension of the gate structures 150 may be in a range from 100 nm to 5000 nm, for example in a range from 300 nm to 1000 nm.

An interlayer dielectric 200 includes an alignment layer 210 formed on the first surface 101 and the field electrode structures 160. The material of the alignment layer 210 may be a semiconductor oxide, for example silicon oxide deposited in a HDP process. The alignment layer 210 includes mask pits 211 in the vertical projection of at least portions of the field electrode structures 160. According to an embodiment, the mask pits 211 are formed in the vertical projection of the field dielectrics 161. Sidewalls 212 of the mask pits 211 have a smaller tilt angle α with respect to the first surface 101 than sidewalls of the field electrode structures 160. Between neighboring mask pits 211 a mask opening 214 in the alignment layer 210 extends in a vertical direction through the alignment layer 210. The mask opening 214 is in the vertical projection of the gate structure 150.

The interlayer dielectric 200 further includes a dielectric layer 220 formed on the alignment layer 210 and filling the mask pits 211 as well as the mask openings 214. The dielectric layer 220 may include one or more insulator layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

A first load electrode 310 formed on the interlayer dielectric 200 may form or may be electrically coupled or connected to a first load terminal, for example a source terminal in case the semiconductor device 500 is an IGFET, an emitter terminal in case the semiconductor device 500 is an IGBT or an anode terminal in case the semiconductor device 500 is an MGD. A second load electrode 320, which directly adjoins the second surface 102 and the contact portion 129, may form or may be electrically connected to a second load terminal, which may be the drain terminal in case the semiconductor device 500 is an IGFET, the collector terminal in case the semiconductor device 500 is an IGBT or a cathode terminal in case the semiconductor device 500 is a MGD.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

At a distance to the first surface 101 a buried contact 163 in the vertical projection of at least a portion of a field dielectric 161 directly adjoins the field electrode 165 at one side and the body zone 115 or the body zone 115 as well as the source zone 110 at the opposite side.

Contact structures 315 extend through openings in the interlayer dielectric 200 and electrically connect the first load electrode 310 with the field electrodes 165 and, through the buried contacts 163 with the source and body zones 110, 115 of the transistor cells TC. The buried contacts 163 as well as the contact structures 315 may include one or more conductive metal containing layers based on, e.g., titanium (Ti) or tantalum (Ta) and a metal fill portion, e.g., based on tungsten (W). According to other embodiments the contact structures 315 may include heavily doped polycrystalline structures. The gate structure 150 is formed in the center of the mesa cell 170. With the mask pits 211 self-aligned to the field electrode structures 160 and the gate structure 150 self-aligned to the mask pits 211, no mask alignment tolerances have to be considered when aligning the gate structures 150 to the field electrode structures 160. As a consequence, the mesa width wM can be significantly reduced compared to approaches using different photolithographic masks for defining the field electrode structures 160 on the one hand and the gate structures 150 on the other hand.

In addition, the buried contact structures 163 may spare a surface contact of the source zones 110 and the body zones 115 that may consume mesa area. As a result, the mesa width wM between neighboring field electrode structures can be reduced to below 800 nm, for example to below 500 nm at high yield. A narrow mesa width wM may improve a trade-off between breakdown performance and on-state resistance, e.g., for semiconductor devices specified for a comparatively low breakdown voltage.

FIGS. 3A to 3K refer to a method of manufacturing semiconductor devices with gate structures 150 formed self-aligned to field electrode structures 160 used as the subsurface structures 160*a* of FIGS. 1A to 1C.

A semiconductor substrate 500*a* consists of or includes a semiconductor layer 100*a* of a single-crystalline semiconductor material. The semiconductor substrate 500*a* may be a semiconductor wafer from which a plurality of identical semiconductor dies is obtained. The single-crystalline semiconductor material of the semiconductor layer 100*a* may be Si, SiC, Ge, SiGe, GaN, GaAs or any other $A_{III}B_V$ semiconductor. The semiconductor layer 100*a* may be intrinsic or lightly doped. According to an embodiment, the semiconductor layer 100*a* is lightly n-doped. For example, the semiconductor layer 100*a* contains phosphorus (P) and/or arsenic (As) atoms. A planar process surface 101*a* of the semiconductor layer 100*a* is exposed at a front side. At an opposite rear side, the semiconductor substrate 500*a* may have a planar rear side surface 102*a*.

Field electrode structures 160 extend from the first surface 101*a* into the semiconductor layer 100*a* down to a bottom plane BPL. Each field electrode structure 160 includes a conductive stripe-shaped or spicular field electrode 165 as well as a field dielectric 161 surrounding the field electrode 165. The field electrodes 165 include or consist of a heavily doped polycrystalline silicon layer and/or a metal containing layer. The field dielectrics 161 separate the field electrodes 165 from the surrounding semiconductor material of the semiconductor layer 100*a* and may include or consist of a thermally grown silicon oxide layer, a deposited silicon oxide layer, e.g., a silicon oxide based on TEOS or both. The cross-sectional areas of the field electrodes 165 and the field electrode structures 160 may be stripes with a first horizontal extension exceeding at least ten times a second horizontal extension perpendicular to the first horizontal extension. According to other embodiments, the cross-sectional areas of the field electrodes 165 and the field electrode structures 160 are dot-shaped with a first horizontal extension exceeding the second horizontal extension at most three times. For example, the cross-sectional areas may be rectangles, regular or distorted polygons such as hexagons or octagons with or without rounded and/or beveled corners, respectively. According to an embodiment, the first and second horizontal extensions are approximately equal and the cross-sectional areas of the field electrodes 165 and the field electrode structures 160 are regular polygons such as octagons, hexagons or squares with or without rounded and/or beveled corners, respectively.

According to other embodiments, the cross-sectional areas of the field electrodes 165 and the field electrode structures 160 may be ellipses or ovals, or, in case the first and second horizontal extensions are equal, circles.

A minimum horizontal extension wFE of the field electrodes 165 may be in a range from 0.1 μm to 20 μm, for example in a range from 0.2 μm to 5 μm. A distance between the process surface 101*a* and the bottom plane BPL gives a vertical extension vFES of the field electrode structure 160 and may be in a range from 1 μm to 50 μm, for example in a range from 2 μm to 20 μm.

Buried bottom sections of the field electrode structures 160 may be approximately horizontal or may be rounded. Vertical sidewall sections of the field electrode structures 160 between the process surface 101*a* and the bottom section may be strictly vertical, may slightly taper and/or may be bulgy.

Portions of the semiconductor layer 100*a* between neighboring field electrode structures 160 form mesa sections 170. The mesa sections 170 may be stripe-shaped or may form a grid embedding spicular field electrode structures 160. A minimum mesa width wM may be in a range from 300 nm to 1 μm, for example in a range from 400 nm to 800 nm.

A first mask layer is deposited and patterned by photolithography to form a first mask 410 exposing at least transistor cell regions 610 surrounded by edge regions 690, respectively. Using the first mask 410 as an implant mask dopants may be introduced for forming body wells 115*a* in the mesa sections 170 of the transistor cell regions 610. According to an embodiment, acceptor atoms may be implanted at a distance to the process surface 101*a*. Then the semiconductor substrate 500*a* may be tempered to anneal the implant damages and to diffuse the implanted dopants. Using the first mask 410 or another mask replacing the first mask 410, donor atoms may be implanted close to the process surface 101a. The semiconductor substrate 500a may be tempered to anneal the implant damage and to diffuse out the implanted dopants to form source wells 110a in the mesa sections 170 of the transistor cell regions 610.

Figure 3B:
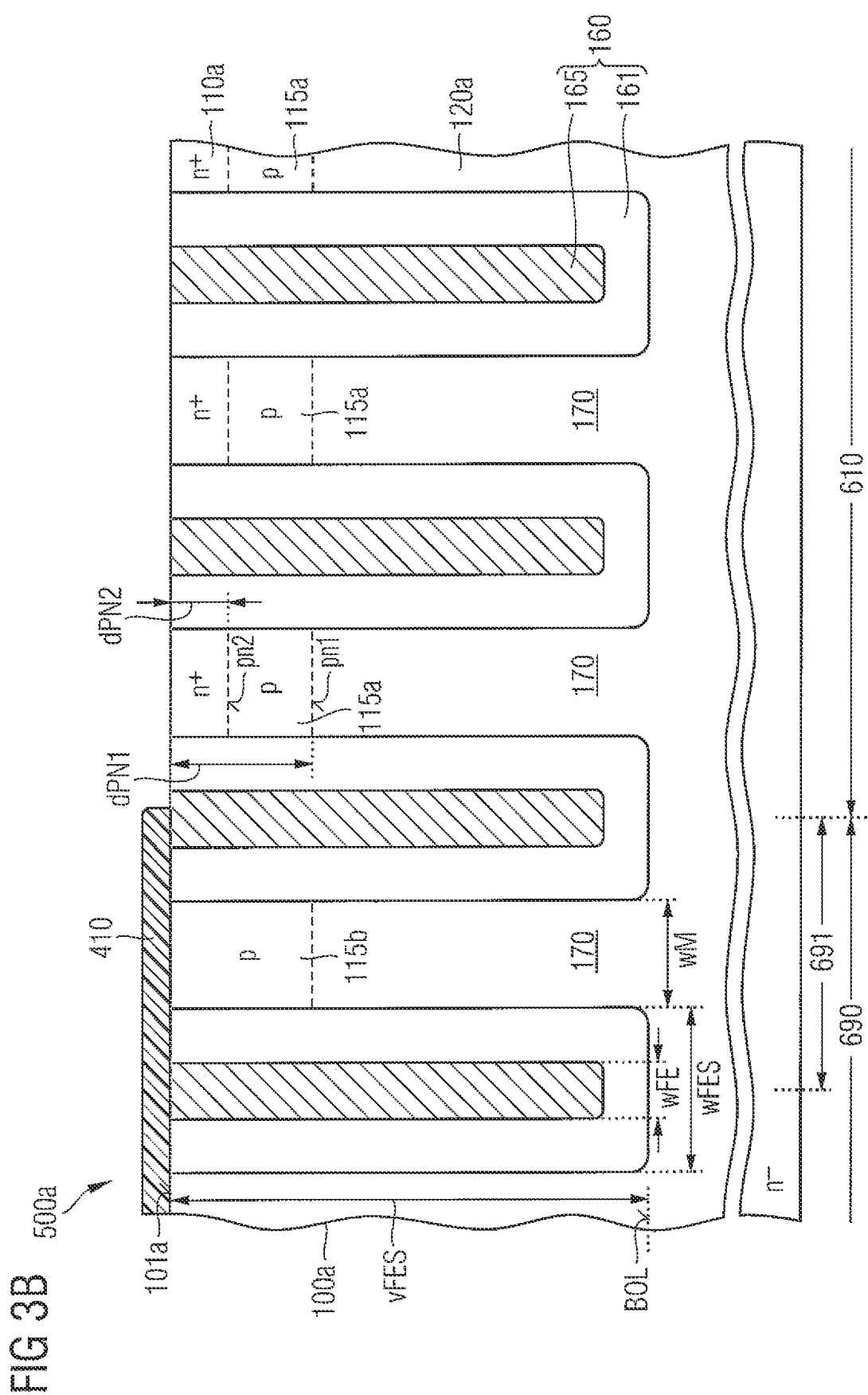
FIG. 3B is a schematic cross-sectional view of the semiconductor substrate portion of FIG. 3A, after forming source and body wells.

FIG. 3B shows the first mask 410 covering the edge portion 690. In the mesa sections 170 of the transistor cell regions 610 source wells 110a are formed alone the process surface 101a. Body wells 115a separate the source wells 110a from the remaining portion of the semiconductor layer 100a forming a drift region 120a. First pn junctions pn1 formed between the body wells 115a and the drift region 120a have a distance dPN1 to the process surface 101a. The distance dPN1 may be in a range from 800 nm to 2000 nm. Second pn junctions pn2 between the source wells 110a and the body wells 115a may have a distance dPN2 to the process surface 101a. The distance dPN2 may be in a range from 100 nm to 800 nm, for example from 200 nm to 600 nm.

The implants for the formation of the body and source wells 115a, 110a may use the same etch mask 410 as illustrated. According to another embodiment, the implant mask for the body wells 115a may expose, in addition to the transistor cell region 610, transition regions 691 of the edge regions 690, wherein the transition regions 690 directly adjoin the transistor cell regions 610 and wherein p wells 115b are formed in the transition area 691 along the process surface 101a.

Using the first mask 410 of FIG. 3B or a second mask 420 replacing the first mask 410 as an etch mask, the field dielectrics 691 are recessed in the transistor cell region 610. For example, the recess is an oxide etch, e.g. a wet etch process selectively recessing the exposed portions of the field dielectrics 161, wherein the recess starts from the plane of the process surface 101a.

FIG. 3C shows recesses 162a resulting from the recess of the field dielectrics 161. A vertical extension vPR of the recesses 162 is greater than the distance dPN2 of the second pn junctions pn2 to the process surface 101a and smaller than the distance dPN1 of the first pn junctions pn1 to the process surface 101a. The recesses 162a expose sidewalls of the mesa sections 170 as well as portions of the body wells 115a formed within the mesa sections 170.

Using the second mask 420 of FIG. 3C, the first mask 410 of FIG. 3B or a further mask replacing the first or second mask 410, 420 as an implant mask, acceptor atoms may be implanted by an angled implant into exposed sidewall portions of the mesa sections 170.

Figure 3D:
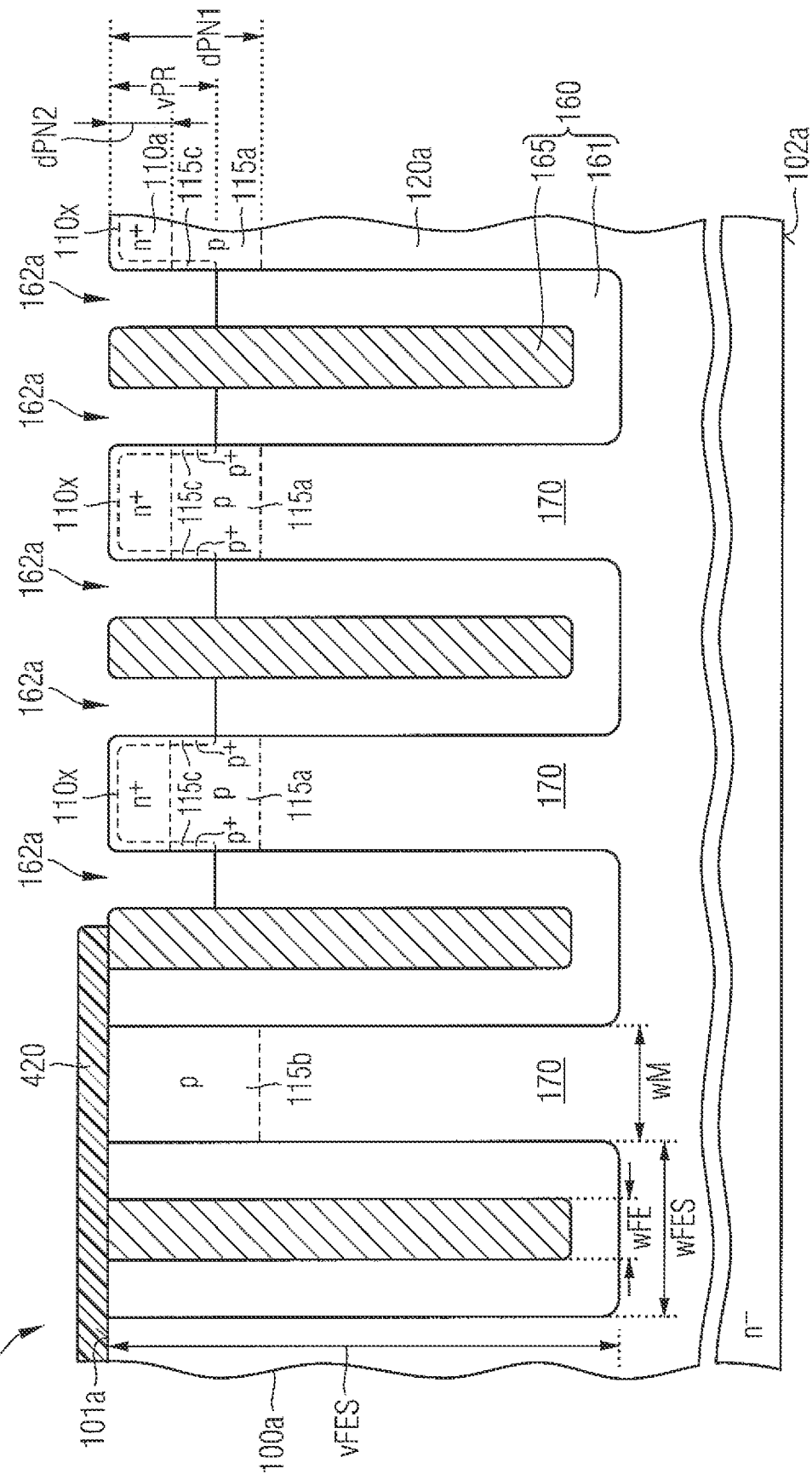
FIG. 3D is a schematic cross-sectional view of the semiconductor substrate portion of FIG. 3C, after forming body contact zones.

FIG. 3D shows heavily doped body contact zones 115c formed along exposed sidewall portions of the body wells 115a as well as a counter implant zone 110x along exposed surfaces of the source wells 110a.

The mask used as the implant mask for forming the body contact zones 115c, e.g., the second mask 420 is removed. Conductive material may be deposited to form buried contacts 163 in first portions of the recesses 162a. According to an embodiment, an interface layer 163a containing Ti and/or Ta, for example TaN, may be deposited that lines the recesses 162a. A conductive fill material 163b, for example a metal such as Tungsten is deposited to fill the remaining voids. The deposited materials may be commonly recessed.

FIG. 3E shows the buried contacts 163 formed from the deposited and recessed conductive interface layer 163a and the conductive fill material 163b. The buried contacts 163 directly adjoin the heavily doped body contact zones 115c as well as the field electrodes 165. In the vertical projection of the buried contacts 163 first trenches 162 extend from a plane spanned by the process surface 101a down to an exposed surface of the buried contact structures 163. A vertical extension vR of the first trenches 162 is smaller than the distance dPN2 between the second pn junctions pn2 and the process surface 101a. According to an embodiment, the vertical extension of the first trenches 162 may be in a range from 100 nm to 160 nm.

Donor atoms may be implanted through exposed surfaces of the mesa sections 170 to achieve a sufficient high donor concentration along the process surface 101a to form ohmic contacts with a metal. For example, arsenic atoms may be implanted using an implant mask exposing the transistor cell regions 610. According to another embodiment, heavily doped polycrystalline silicon containing donors may be deposited at least in the transistor cell regions 610 and the donors may be diffused out from the polycrystalline layer into the mesa sections 170. According to a further embodiment, the implant for forming the source wells 110a provides an implant dose which is sufficiently high to achieve the desired quality of the ohmic contact to the metal even after the counter implant for forming the body contact zones 115c.

An alignment layer 210 is deposited on the process surface 101a and in the first trenches 162 in a way that in the vertical projection of the first trenches 162 mask pits 211 are in-situ formed in the alignment layer 210. According to an embodiment, a HDP process deposits silicon oxide to form the alignment layer 210. During deposition, the sputter power may be in a range from 800 to 1200 Watt and the sputter atoms may be Argon (Ar) atoms, oxygen atoms or $SiH_4$ molecules.

Figure 3F:
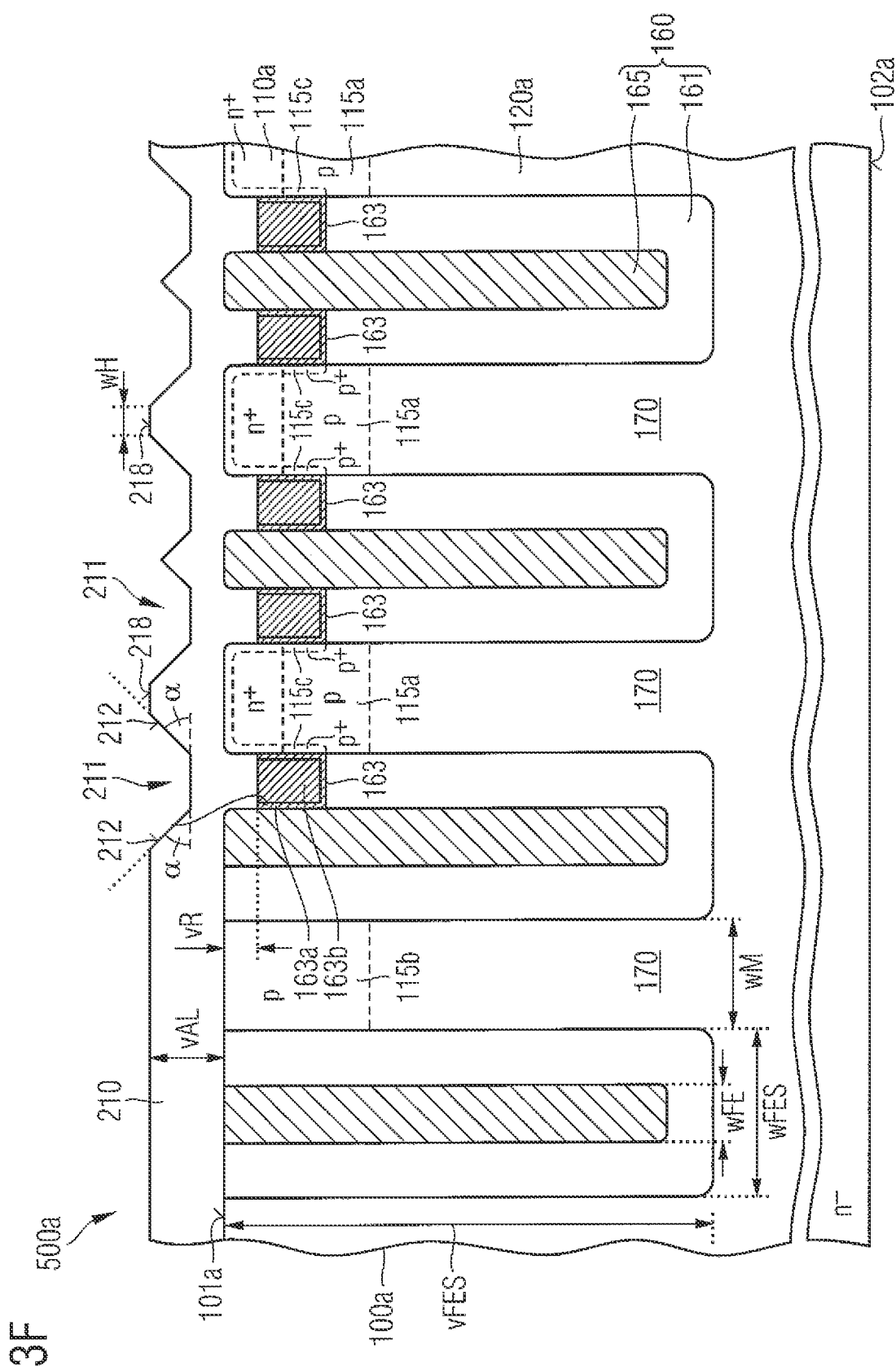
FIG. 3F is a schematic cross-sectional view of the semiconductor substrate portion of FIG. 3E, after forming an alignment layer with mask pits in the vertical projection of the buried contacts.

FIG. 3F shows details of the alignment layer 210 and the mask pits 211. The thickness vAL of the alignment layer 210 is selected such that after deposition, the alignment layer 210 completely fills the first trenches 162, and such that a horizontal portion 218 of the alignment layer 210 between neighboring field electrode structures 160 has a minimum width of at least 20 nm, for example at least 40 nm. In the rest, the thickness vAL of the alignment layer 210 determines the distance between the field electrode structures 160 and gate structures formed in the mesa sections 170 in the vertical projection of the horizontal portion 218 in the following. The thickness vAL of the alignment layer 210 may be in a range from 200 nm to 250 nm, by way of example.

A tilt angle α between sidewalls 212 of the mask pits 211 and the process surface 101a is in a range from 30 degree to 60 degree, for example in a range from 40 to 45 degree. According to an embodiment, the tilt angle α is approximately 43 degree.

An auxiliary material different from the material of the alignment layer 210 is deposited to completely fill the mask pits 211. The auxiliary material deposited outside the mask pits 211 may be removed by a polishing step, for example by CMP. A further slight recess of the auxiliary material may compensate for deviations caused by process fluctuations of the deposition process for the alignment layer 210.

FIG. 3G shows the auxiliary material forming a first mask portion 431 of a third mask. In the vertical projection of the mesa sections 170 a width wH between neighboring sections of the first mask portion 431 defines position and width of gate structures to be formed in the following. The auxiliary material may be any material against which the material of the alignment layer 210 is selectively etchable. According to an embodiment, the alignment layer 210 is a silicon oxide layer and the auxiliary material is selected from polycrystalline silicon, carbon, photoresist materials and silicon nitride. A third mask layer is deposited and patterned by photolithography to form a second mask portion 432 of the third mask 430.

Figure 3H:
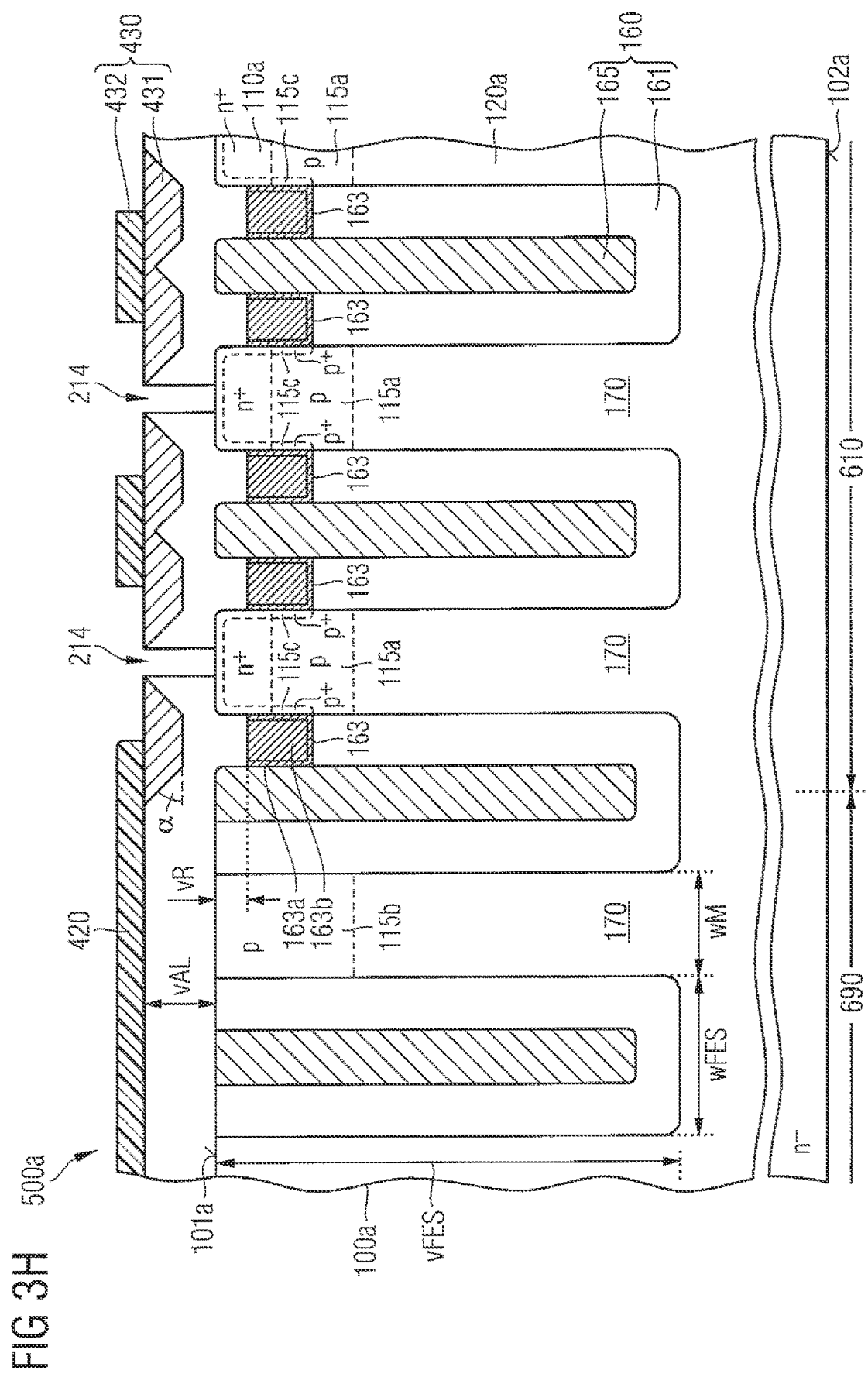
FIG. 3H is a schematic cross-sectional view of the semiconductor substrate portion of FIG. 3G, after forming mask openings in the alignment layer between the mask pits.
Figure 3:
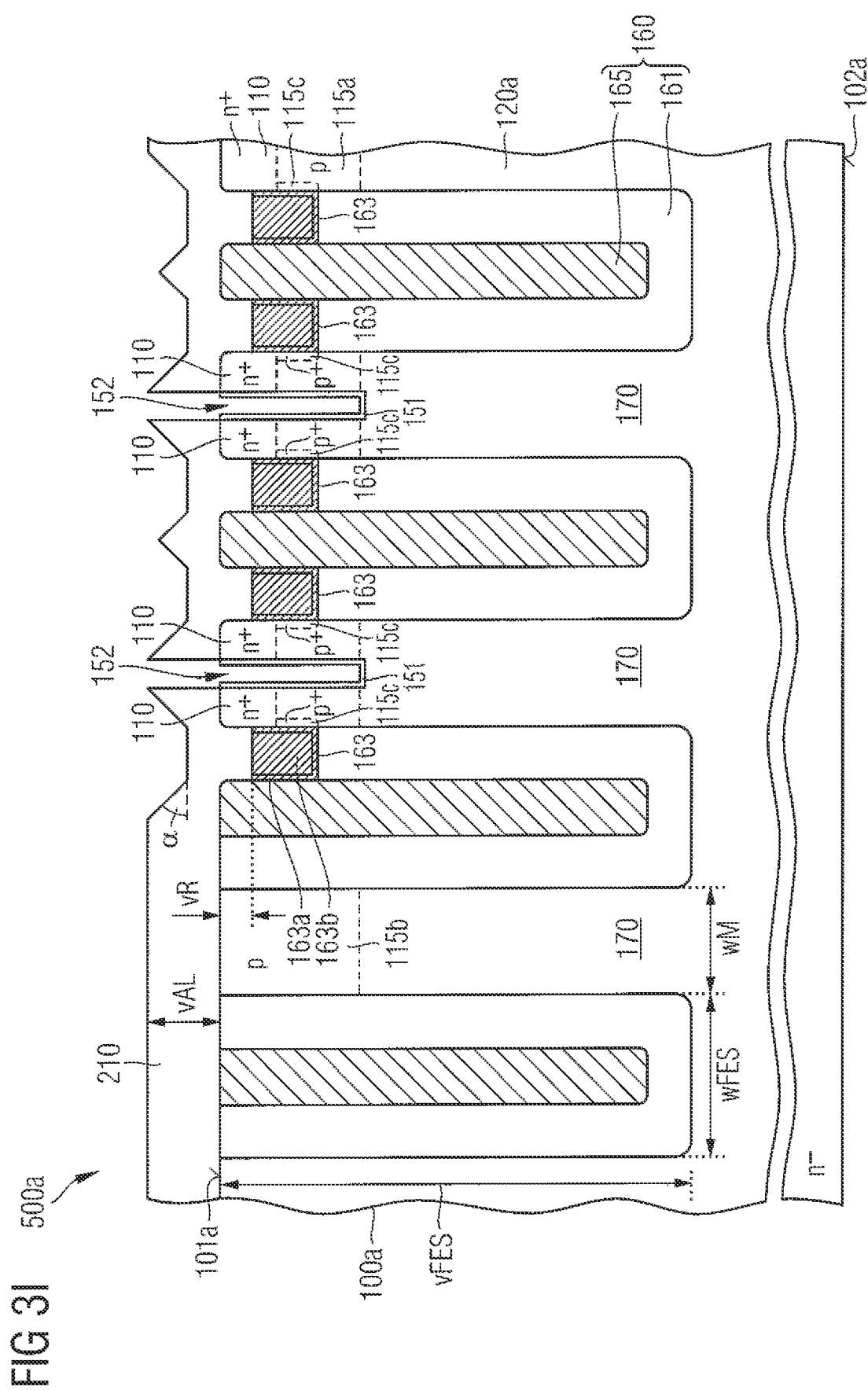
FIG. 3A is a schematic cross-sectional view of a portion of a semiconductor substrate for illustrating a method of manufacturing a semiconductor device according to an embodiment concerning compensations structures, after forming field electrode structures.
FIG. 3C is a schematic cross-sectional view of the semiconductor substrate portion of FIG. 3B, after forming recesses in field dielectrics in a transistor cell region.
FIG. 3E is a schematic cross-sectional view of the semiconductor substrate portion of FIG. 3D, after depositing conductive material in the recesses to form buried contacts.
FIG. 3G is a schematic cross-sectional view of the semiconductor substrate portion of FIG. 3F, after filling the mask pits with an auxiliary material.
FIG. 3I is a schematic cross-sectional view of the semiconductor substrate portion of FIG. 3H, after forming gate trenches in the vertical projection of the mask openings.
FIG. 3J is a schematic cross-sectional view of the semiconductor substrate portion of FIG. 3I, after forming gate structures in the gate trenches.
FIG. 3K is a schematic cross-sectional view of the semiconductor substrate portion of FIG. 3J, after forming an etch mask for field electrode contacts.

As illustrated in FIG. 3H the second mask portion 432 may cover the edge regions 690 and may expose the transistor cell regions 610. According to the illustrated embodiment, openings in the second mask portion 432 expose portions of the alignment layer 210 around the gaps in the first mask portion 431. The material of the second mask portion 432 is any material against which the material of the alignment layer 210 can be etched with high selectivity and is another material as the auxiliary material forming the first mask portions 431. According to an embodiment, the second mask portion 432 includes or consists of silicon nitride, photoresist, or carbon.

Alignment tolerances for the openings in the second mask portion 432 are relaxed since the first mask portions 431 ensure that the resulting mask openings 214 in the alignment layer 210 are fine-adjusted in the center of the mesa sections 170. Using the third mask 430 as a combined etch mask, mask openings 214 are etched into the alignment layer 210 in the vertical projection of the mesa sections 170.

The second mask portion 432 may be removed and gate trenches 152 may be etched into the mesa sections 170 exposed by the mask openings 214 in the alignment layer 210. The auxiliary material forming the first mask portion 431 may be previously removed or may be consumed during the formation of the gate trenches 152. A gate dielectric 151 may be formed at least along exposed sidewalls of the mesa sections 170.

FIG. 3I shows the gate trenches 152 centered with respect to the neighboring field electrode structures 160. A vertical extension of the gate trenches 152 is greater than the distance dPN1 between the first pn junction pn1 and the process surface 101a. The gate trenches 152 extend through the source wells 110a and body wells 115a of FIG. 3H. On opposing sides of the gate trenches 152, source zones 110 are formed from the source wells 110a of FIG. 3H and body zones 115 are formed from the body wells 115a of FIG. 3H. Gate dielectrics 151, for example from thermally grown silicon oxide, line the gate trenches 152.

Conductive material may be deposited and recessed to form gate electrodes 155 in the gate trenches 152. The conductive material may be a metal, a conductive metal compound, heavily doped polycrystalline silicon or a combination thereof. The recess may include a CMP and a wet etch. Along sidewalls of the mask openings 214 in the alignment layer 210 dielectric spacers may be formed from a material different from the material of the alignment layer 210. Then a further dielectric layer 220 may be deposited for completing an interlayer dielectric 200.

Figure 3J:
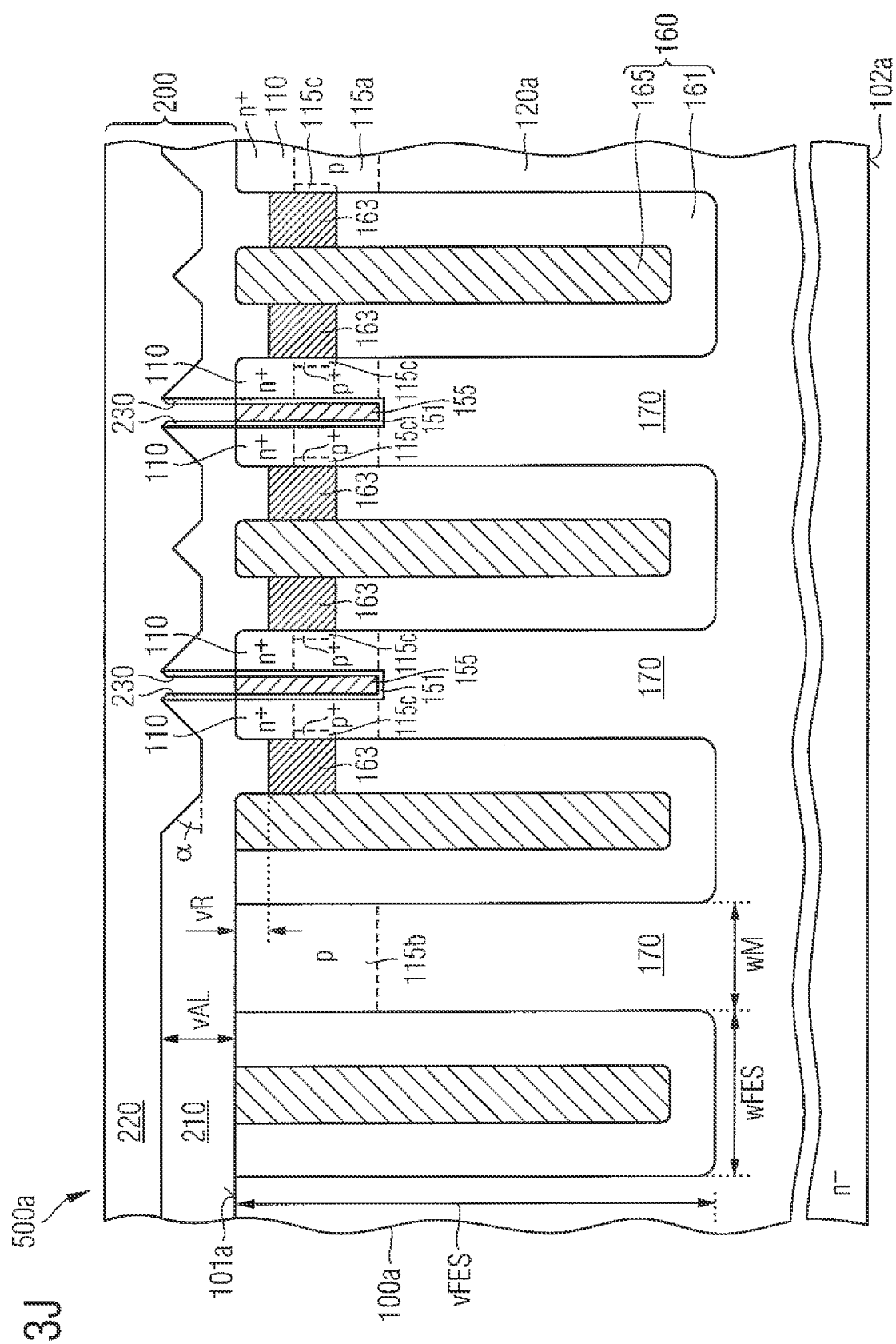

FIG. 3J shows auxiliary spacers 230 lining the mask openings 214 in the alignment layer 210. The auxiliary spacers 230 may be formed from silicon nitride and may support the formation of self-aligned gate contacts as described below with regard to FIG. 4E.

The dielectric layer 220 covers the alignment layer 210 and fills the mask pits 211 as well as the mask openings 214 in the alignment layer 210. The dielectric layer 220 may be or may include deposited silicon oxide, for example a silicon oxide based on TEOS, BSG, PSG, BPSG, or a combination thereof. In combination with the alignment layer 210 the dielectric layer 220 forms an interlayer dielectric 200. A fourth mask layer may be deposited and patterned by photolithography to form a fourth mask 440.

Figure 3K:
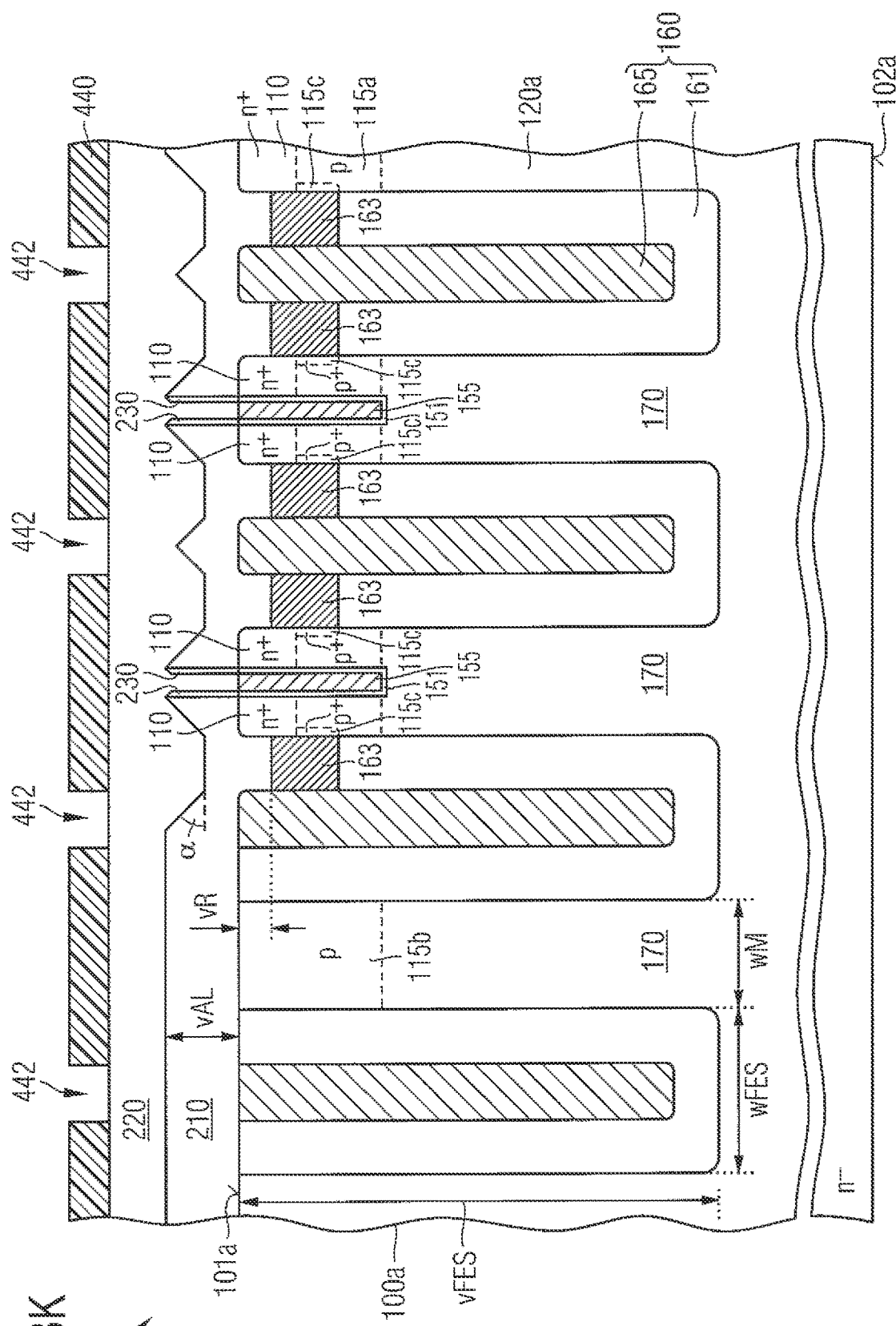

FIG. 3K shows the fourth mask 440 with openings 442 in the vertical projection of the field electrodes 165. Using the fourth mask 440 as an etch mask, contact trenches may be etched through the interlayer dielectric 200 to the field electrodes 165. The contact trenches may be filled with a conductive material to form contact structures. Conductive material, form example aluminum, copper or a combination of aluminum and copper with or without silicon may be deposited to form a first load electrode at the front side defined by the process surface 101a. A drain structure and a second load electrode may be completed at the rear side to form devices as illustrated in the following figures.

FIGS. 4A to 4D refer to IGFETs 501 with heavily n-doped contact portions 129 along the second surface 102a. The transistor cells TC are formed in a transistor cell region 610. An edge area 690 without transistor cells TC surrounds the transistor cell area 610. For further details, reference is made to the description of FIG. 2.

Figure 4B:
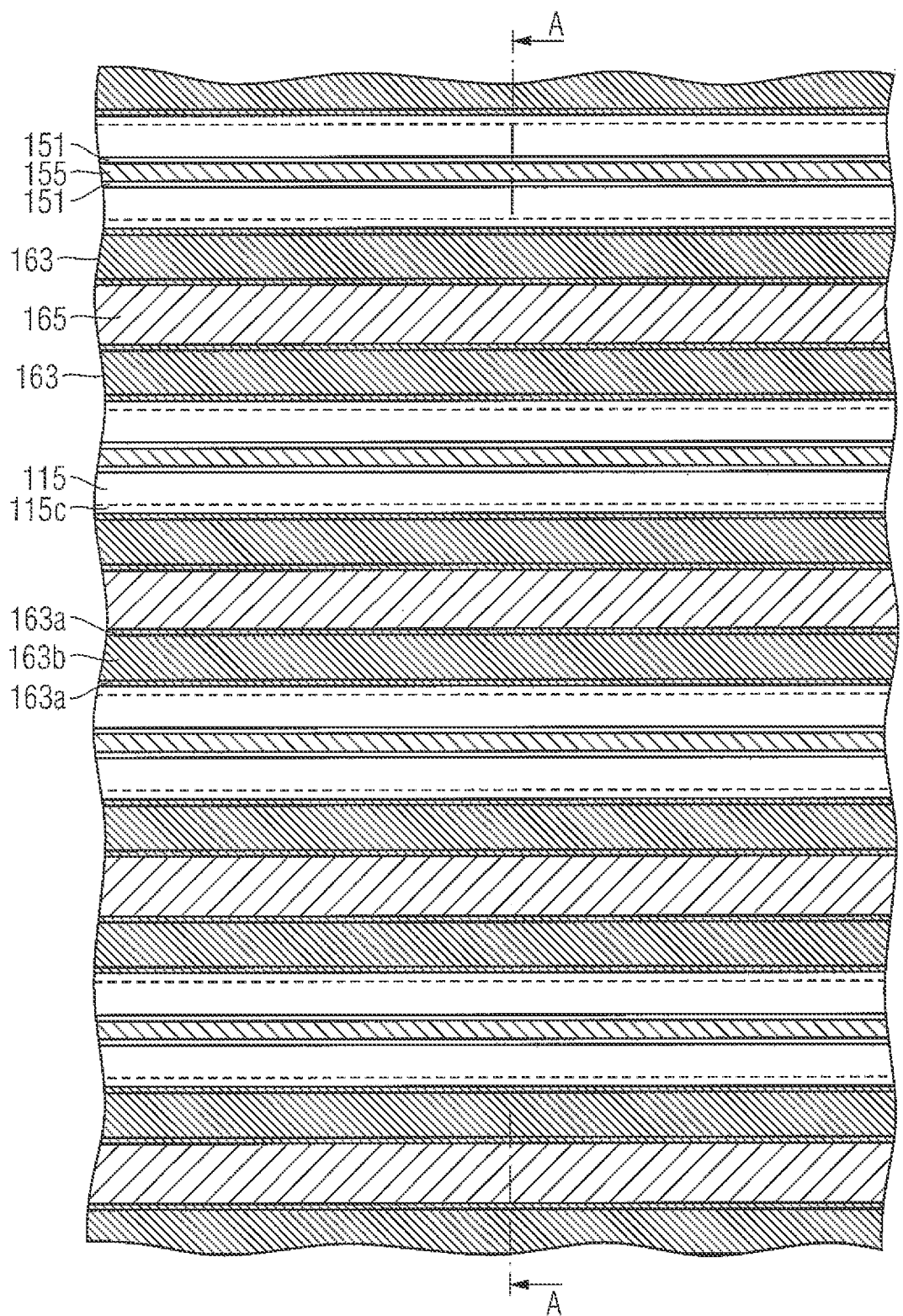
FIG. 4B is a schematic horizontal cross-sectional view of the semiconductor device of FIG. 4A along line I-I according to an embodiment related to stripe-shaped gate and field electrodes.

FIG. 4B refers to an embodiment with stripe-shaped gate structures 150 and stripe-shaped field electrode structures 160.

Figure 4C:
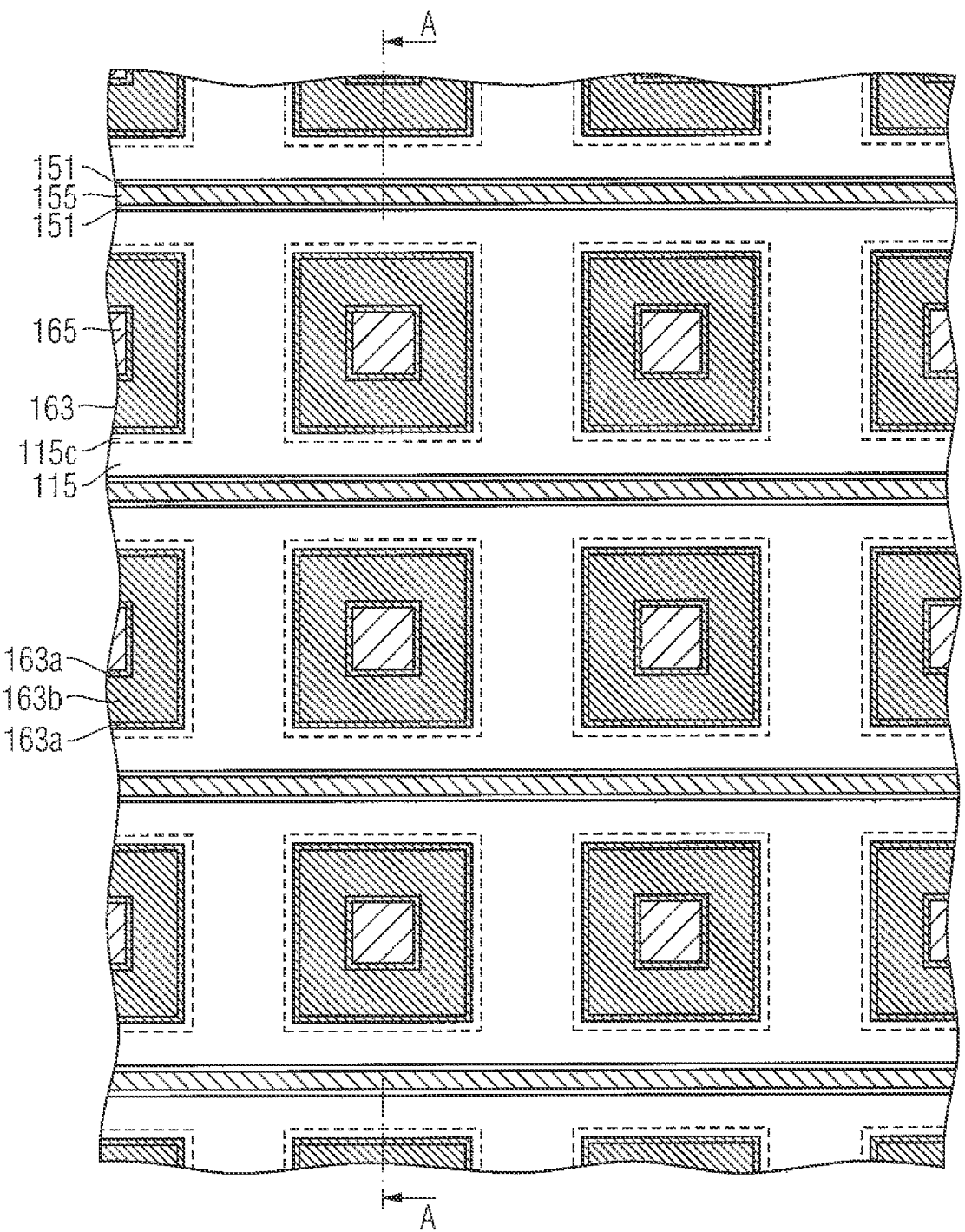
FIG. 4C is a schematic horizontal cross-sectional view of the semiconductor device of FIG. 4A along line I-I according to an embodiment related to stripe-shaped gate electrodes and spicular field electrodes arranged in lines.

According to the embodiment of FIG. 4C, needle-shaped field electrode structures 160 are arranged along lines. Stripe shaped gate structures 150 are arranged between neighboring lines of needle-shaped field electrode structures 160.

Figure 4D:
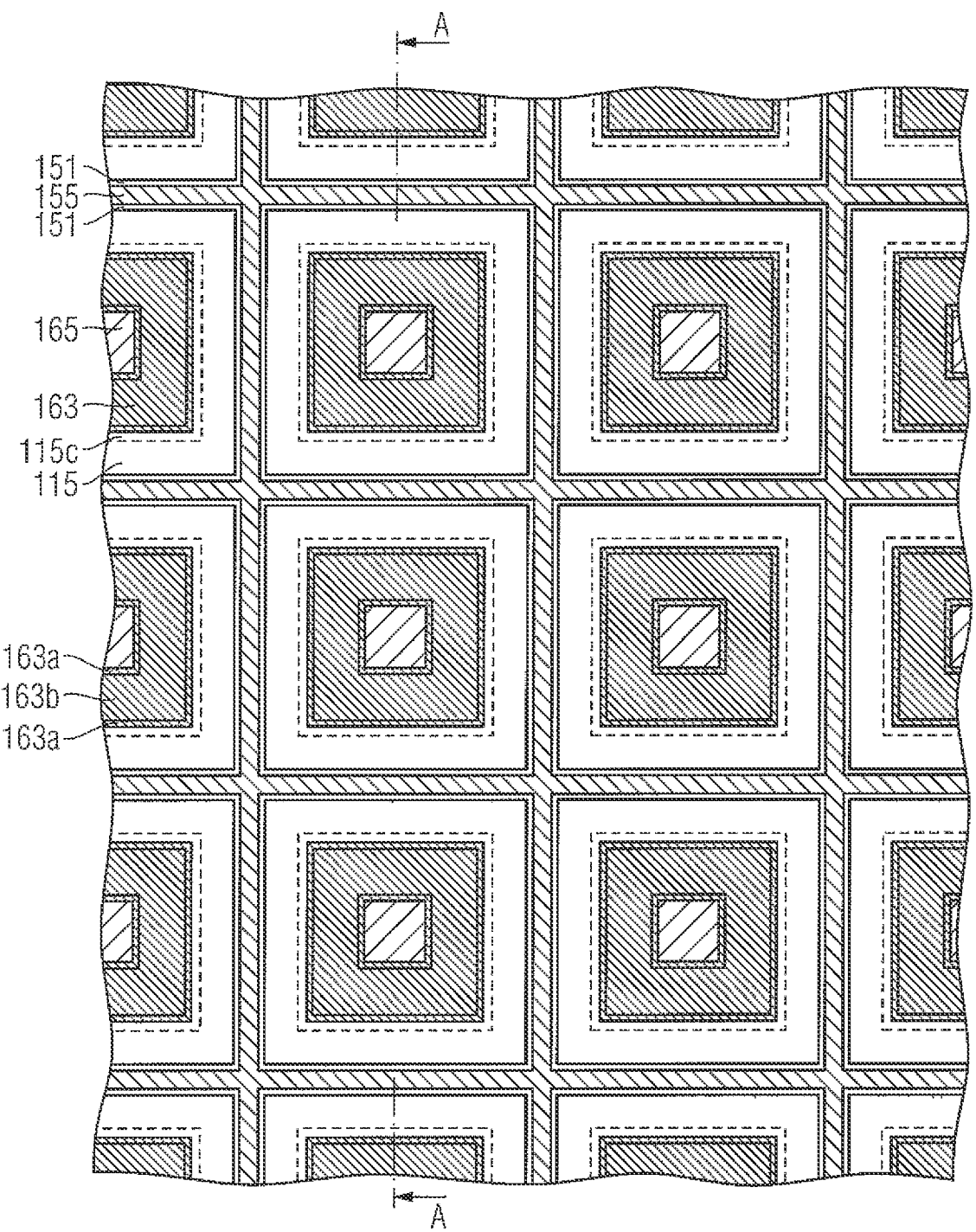
FIG. 4D is a schematic horizontal cross-sectional view of the semiconductor device of FIG. 4A along line I-I according to an embodiment related to a grid-shaped gate structure with spicular field electrode structures formed in the meshes of the grid.

The IGFET 501 of FIG. 4D includes needle-shaped field electrode structures 160 and a grid-like gate structure 150, wherein the field electrode structures 160 are arranged in the meshes of the grid formed by the gate structures 150.

FIG. 4E is a schematic vertical cross-sectional view of the semiconductor device of FIG. 4A through a transition region 691 in a plane parallel to the cross-sectional plane of FIG. 4A. The transition region 691 directly adjoins the transistor cell region 610 and includes field electrode structures 160 as well as p wells 115b in mesa sections 170 between the field electrode structures. Gate structures 150 extend from the transistor cell region into the transition region 691.

The transition region 691 is devoid of any source zones or of such source zones that are electrically connected to the first load electrode. A metal control electrode 330 is formed on the interlayer dielectric 200. Gate contacts 315g extend from the control electrode 330 through the dielectric layer 220 and through the mask opening 214 in the alignment layer 210 to or into the gate electrodes 155. The mask openings 214 in combination with a selective etch of the dielectric layer 220 relax the alignment conditions for a mask defining contact trenches for the gate contacts 315g in the interlayer dielectric 200. Auxiliary spacers 230 along sidewalls of the mask openings 214 may support a guided etch through a portion of the interlayer dielectric 200.

Figure 5:
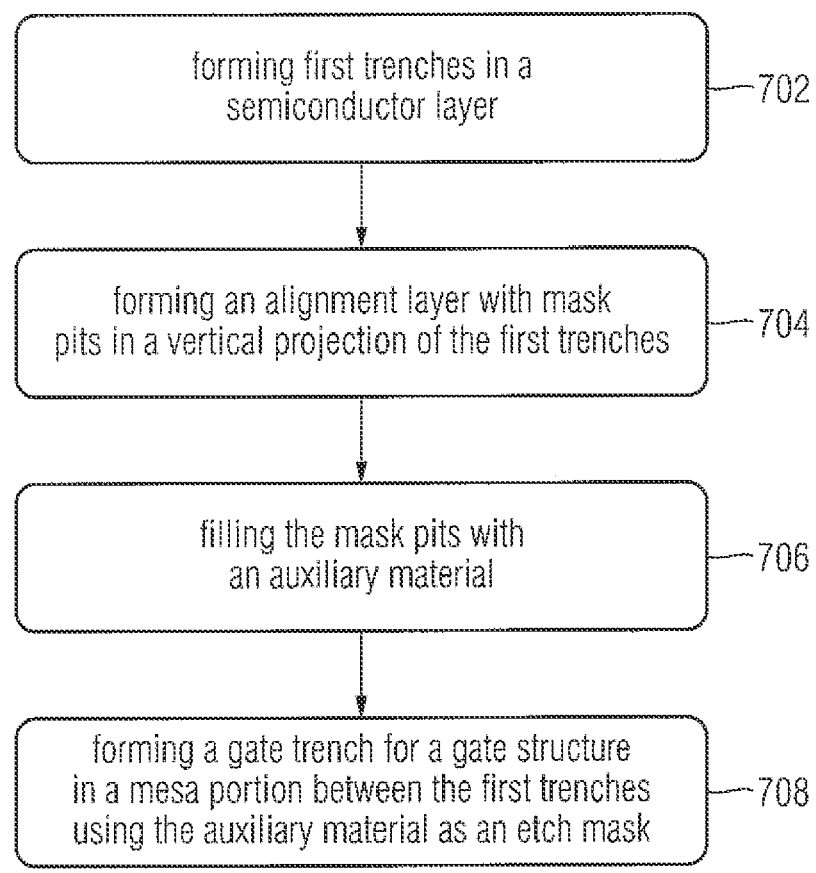
FIG. 5 is a simplified flowchart of a method for manufacturing a semiconductor device according to a further embodiment.

FIG. 5 refers to a method of manufacturing a semiconductor device. First trenches are formed that extend from a process surface into a semiconductor layer (702). An alignment layer with mask pits in a with respect to the process surface vertical projection of the first trenches is formed on the process surface, wherein sidewalls of the mask pits have a smaller tilt angle with respect to the process surface than sidewalls of the first trenches (704). The mask pits are filled with an auxiliary material (706). In a mesa section of the semiconductor layer between the first trenches, a gate trench for a gate structure is formed by using the auxiliary material as an etch mask (708).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device comprising:
a gate structure extending from a first surface of a semiconductor portion into a mesa section between neighboring field electrode structures; and
an alignment layer formed on the first surface,
wherein the alignment layer comprises mask pits formed in the alignment layer in a vertical projection of the field electrode structures,
wherein sidewalls of the mask pits have a smaller tilt angle with respect to the first surface than sidewalls of the field electrode structures,
wherein the gate structure is in the vertical projection of a gap between neighboring mask pits.

2. The semiconductor device of claim 1, wherein each of the field electrode structures comprises a field electrode and a field dielectric that separates the field electrode from a material of the semiconductor portion.

3. The semiconductor device of claim 2, further comprising:
a buried contact formed at a distance to the first surface and directly adjoining the mesa section and one of the field electrodes.

4. The semiconductor device of claim 1, wherein the tilt angle of the sidewalls of the mask pits with respect to the first surface is between 30 degree and 60 degree.

5. The semiconductor device of claim 1, wherein the alignment layer is formed by high density plasma deposition of silicon oxide.

6. The semiconductor device of claim 1, further comprising:
an auxiliary spacer formed along sidewalls of openings in the alignment layer between neighboring mask pits.

7. A semiconductor device, comprising:
first trenches extending from a first surface into a semiconductor layer;
an alignment layer on the first surface and comprising mask pits formed in the alignment layer in a vertical projection of the first trenches, wherein sidewalls of the mask pits have a smaller tilt angle with respect to the first surface than sidewalls of the first trenches; and
a gate trench formed in a mesa section of the semiconductor layer between the first trenches.

8. The semiconductor device of claim 7, further comprising:
a buried contact at a bottom of the first trenches.

9. The semiconductor device of claim 8, wherein each buried contact comprises a conductive material recessed below the first surface.

10. The semiconductor device of claim 7, wherein the first trenches are etched into the semiconductor layer.

11. The semiconductor device of claim 7, wherein the first trenches are vertically aligned with recessed subsurface structures formed in the semiconductor layer.

12. The semiconductor device of claim 11, wherein the recessed subsurface structures are conductive structures recessed below the first surface.

13. The semiconductor device of claim 11, wherein the recessed subsurface structures are insulator structures recessed below the first surface.

14. The semiconductor device of claim 11, wherein the recessed subsurface structures comprise field electrodes separated from a material of the semiconductor layer by a field dielectric.

15. The semiconductor device of claim 7, wherein the alignment layer completely fills the first trenches.

16. The semiconductor device of claim 7, further comprising:
a gate electrode in the gate trench; and
a gate dielectric insulating the gate electrode from the mesa section of the semiconductor layer.

17. The semiconductor device of claim 7, further comprising:
field electrode structures,
wherein the first trenches are laterally interposed between the field electrode structures and the gate trench.

18. The semiconductor device of claim 17, wherein each of the field electrode structures comprises a field electrode and a buried contact laterally extending from the field electrode to the mesa section of the semiconductor layer.

19. The semiconductor device of claim 7, further comprising:
an auxiliary spacer formed along sidewalls of openings in the alignment layer between neighboring mask pits.

20. A semiconductor device, comprising:
a plurality of transistor cells each of which comprises:
a field electrode structure or a portion of a field electrode structure extending from a first surface into a semiconductor portion;
at least one doped semiconductor region formed in a mesa section of the semiconductor portion; and
a gate structure formed in the mesa section and comprising a gate electrode insulated against the mesa section by a gate dielectric;
an interlayer dielectric on the first surface and the field electrode structures; and
a first load electrode on the interlayer dielectric,
wherein the interlayer dielectric comprises an alignment layer and a dielectric layer,
wherein the alignment layer has mask pits in a vertical projection of at least portions of the field electrode structures,
wherein sidewalls of the mask pits have a smaller tilt angle with respect to the first surface than sidewalls of the field electrode structures,
wherein between neighboring mask pits, an opening in the alignment layer extends in a vertical direction through the alignment layer,
wherein the openings are in the vertical projection of the gate structures,
wherein the dielectric layer fills the mask pits and the openings.

* * * * *